United States Patent
Lee et al.

(10) Patent No.: US 10,127,074 B2
(45) Date of Patent: Nov. 13, 2018

(54) TRANSACTION IDENTIFICATION SYNCHRONIZATION

(71) Applicant: Futurewei Technologies, Inc., Plano, TX (US)

(72) Inventors: Xiaobing Lee, Santa Clara, CA (US); Feng Yang, Portland, OR (US); Shaojie Chen, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/417,984

(22) Filed: Jan. 27, 2017

(65) Prior Publication Data

US 2018/0219562 A1    Aug. 2, 2018

(51) Int. Cl.
  *G06F 9/46* (2006.01)
  *H03M 13/00* (2006.01)
  *G06F 11/10* (2006.01)
  *H03M 13/09* (2006.01)
  *H03M 13/29* (2006.01)

(52) U.S. Cl.
  CPC .......... *G06F 9/467* (2013.01); *G06F 11/1004* (2013.01); *G06F 11/1076* (2013.01); *H03M 13/09* (2013.01); *H03M 13/2906* (2013.01); *H03M 13/63* (2013.01)

(58) Field of Classification Search
  None
  See application file for complete search history.

(56) References Cited

U.S. PATENT DOCUMENTS 5,751,985 A * 5/1998 Shen ............... G06F 9/3004
                                                712/218
6,694,427 B1 * 2/2004 Mericas .......... G06F 9/3802
                                                712/227

(Continued)

FOREIGN PATENT DOCUMENTS

CN       104636271      5/2015

OTHER PUBLICATIONS

"Internationl Patent Application Serial No. PCT CN2017 108582, International Search Report dated Jan. 29, 2018", 6 pgs.

(Continued)

*Primary Examiner* — Steve Nguyen
(74) *Attorney, Agent, or Firm* — Schwegman Lundberg & Woessner, P.A.

(57) ABSTRACT

Various embodiments include methods and apparatus structured to provide synchronization of a transaction identification between a host and a memory module using a parity check. A transaction identification can be generated at both the host and the memory module independently using incremental counters of these apparatus. Synchronization of the transaction identifications generated by the host and by a controller of the memory module can be implemented using a parity bit sequences pattern of a combination of the generated transaction identification plus the corresponding transaction command and data address. Use of transaction commands modified with respect to transaction identifications can be used in initialization of the synchronization, in message passing, and in error detection and response to errors. Additional apparatus, systems, and methods can be implemented in a variety of applications.

18 Claims, 19 Drawing Sheets

(56) References Cited

U.S. PATENT DOCUMENTS

| | | | |
|---|---|---|---|
| 7,523,342 B1* | 4/2009 | Fu .................. | H04L 1/0045 |
| | | | 714/4.12 |
| 9,632,869 B1* | 4/2017 | Lu ..................... | G11C 29/52 |
| 2011/0161681 A1* | 6/2011 | Dhuse ............. | G06F 11/1092 |
| | | | 713/193 |
| 2012/0191664 A1* | 7/2012 | Wakrat ............ | G06F 12/0246 |
| | | | 707/684 |
| 2012/0266041 A1 | 10/2012 | Wang et al. | |
| 2014/0040550 A1* | 2/2014 | Nale ............... | G06F 12/0868 |
| | | | 711/118 |
| 2014/0059297 A1 | 2/2014 | Biswas et al. | |
| 2014/0089602 A1 | 3/2014 | Biswas et al. | |
| 2015/0089327 A1 | 3/2015 | Youn et al. | |
| 2016/0048423 A1* | 2/2016 | Williams ......... | G06F 11/1004 |
| | | | 714/819 |
| 2016/0379690 A1 | 12/2016 | Bains et al. | |
| 2018/0059933 A1* | 3/2018 | Helmick .......... | G06F 3/061 |

OTHER PUBLICATIONS

"Internationl Patent Application Serial No. PCT CN2017 108582, Written Opinion dated Jan. 29, 2018", 5 pgs.

* cited by examiner

| STEP # | C/A PARITY | TID COUNT VALUE | RUNNING PAR_d | IN-USE TID | COUNT VALUE | PAR_H | TID = | T-CMD #n |
|---|---|---|---|---|---|---|---|---|
| 1 | 1 | 000000 | 0 | | | 1 | 000000 | 1 |
| 2 | 0 | 000001 | 1 | | | 0 | 000001 | 2 |
| 3 | 1 | 000010 | | 000010 | SKIP | | | |
| 4 | 0 | 000011 | 0 | | | 1 | 000011 | 3 |
| 5 | 0 | 000100 | 1 | | | 0 | 000100 | 4 |
| 6 | | 000101 | | 000101 | SKIP | | | 5 |
| 7 | | 000110 | | 000110 | SKIP | | | 5 |
| 8 | 1 | 000111 | 0 | | | 0 | 000111 | 5 |
| 9 | 1 | 001000 | 1 | | | 1 | 001000 | 6 |
| 10 | 0 | 001001 | 0 | | | 0 | 001001 | 7 |
| 11 | | 001010 | | 001010 | SKIP | | | 8 |
| 12 | 1 | 001011 | 1 | | | 1 | 001011 | 8 |
| 13 | 0 | 001100 | 0 | | | 0 | 001100 | 9 |
| 14 | 1 | 001101 | 1 | | | 1 | 001101 | 10 |
| 15 | 1 | 001110 | 0 | | | 0 | 001110 | 11 |
| 16 | 0 | 001111 | 1 | | | 1 | 001111 | 12 |

FIG. 4A

| PARITY | | PAR_d[n] = {0,1,0,1...} | PAR_H[n] = | TID | |
|---|---|---|---|---|---|
| C/A | TID | | | | |
| 0 | 0 | $\overline{PAR\_D[n-1]}$ | PAR_d[n] | PASS | ~410 |
| 0 | 1 | $\overline{PAR\_D[n-1]}$ | PAR_d[n] | PASS | ~420 |
| 1 | 0 | $\overline{PAR\_D[n-1]}$ | PAR_d[n] | PASS | ~430 |
| 1 | 1 | $\overline{PAR\_D[n-1]}$ | PAR_d[n] | PASS | ~440 |

| | CLK0 | | CLK1 | | CLK2 | | CLK3 | | |
|---|---|---|---|---|---|---|---|---|---|
| | $beat_0$ | $beat_1$ | $beat_2$ | $beat_3$ | $beat_4$ | $beat_5$ | $beat_6$ | $beat_7$ | |
| | B0 | B8 | B16 | B24 | B32 | B40 | B48 | B56 | ~710 |
| | B1 | B9 | B17 | B25 | B33 | B41 | B49 | B57 | ~711 |
| | B2 | B10 | B18 | B26 | B34 | B42 | B50 | B58 | ~712 |
| | B3 | B11 | B19 | B27 | B35 | B43 | B51 | B59 | ~713 |
| | $ECC_0$ | $ECC_1$ | $ECC_2$ | $ECC_3$ | $ECC_4$ | $ECC_5$ | $ECC_6$ | $ECC_7$ | ~730 |
| | B4 | B12 | B20 | B28 | B36 | B44 | B52 | B60 | ~714 |
| | B5 | B13 | B21 | B29 | B37 | B45 | B53 | B61 | ~715 |
| | B6 | B14 | B22 | B30 | B38 | B46 | B54 | B62 | ~716 |
| | B7 | B15 | B23 | B31 | B39 | B47 | B55 | B63 | ~717 |
| | Op0 | Op1 | Op0 | TID_Δ0 | TID_Δ1 | TID_Δ2 | TID_Δ3 | TID_Δ4 | ~721 |
| | Op1 | Op0 | Op1 | TID_Δ4 | TID_Δ3 | TID_Δ2 | TID_Δ1 | TID_Δ0 | ~722 |

| OP CODE | OPERATION |
|---|---|
| 0, 0 | WID = TID+1, TID-Δ IS OFFSET TO NEXT RID |
| 0, 1 | WID = TID+1, TID-Δ IS SYNCH TO USED RID |
| 1, 0 | RFU |
| 1, 1 | WID = PREVIOUS TID + EMBED TID-Δ |

*FIG. 7B*

| CLK0 | | CLK1 | | CLK2 | | CLK3 | | |
|---|---|---|---|---|---|---|---|---|
| beat$_0$ | beat$_1$ | beat$_2$ | beat$_3$ | beat$_4$ | beat$_5$ | beat$_6$ | beat$_7$ | |
| B0 | B8 | B16 | B24 | B32 | B40 | B48 | B56 | ~760 |
| B1 | B9 | B17 | B25 | B33 | B41 | B49 | B57 | ~761 |
| B2 | B10 | B18 | B26 | B34 | B42 | B50 | B58 | ~762 |
| B3 | B11 | B19 | B27 | B35 | B43 | B51 | B59 | ~763 |
| Tag$_0$ | Tag$_1$ | Tag$_2$ | Tag$_3$ | Tag$_4$ | Tag$_5$ | Tag$_6$ | Tag$_7$ | ~780 |
| ECC$_0$ | ECC$_1$ | ECC$_2$ | ECC$_3$ | ECC$_4$ | ECC$_5$ | ECC$_6$ | ECC$_7$ | ~782 |
| B4 | B12 | B20 | B28 | B36 | B44 | B52 | B60 | ~764 |
| B5 | B13 | B21 | B29 | B37 | B45 | B53 | B61 | ~765 |
| B6 | B14 | B22 | B30 | B38 | B46 | B54 | B62 | ~766 |
| B7 | B15 | B23 | B31 | B39 | B47 | B55 | B63 | ~767 |
| ACT_n | RA16 | RA15 | RA14 | BG1 | BG0 | BA1 | BA0 | |
| RA17 | RA12 | RA13 | RA11 | RA10 | RA9 | RA8 | C2 | |
| RA7 | RA6 | RA5 | RA4 | RA3 | RA2 | RA1 | C1 | 770 |
| ACT_h | RAS_n | CAS_n | WE_n | EA7 | EA6 | EA5 | C0 | |
| EA4 | EA3 | EA2 | EA1 | EA0 | PAR | CA9 | CA8 | |
| CA7 | CA6 | CA5 | CA4 | CA3 | CA2 | CA1 | CA0 | |
| Op0 | Op1 | Op0 | TID_A0 | TID_A1 | TID_A2 | TID_A3 | TID_A4 | ~771 |
| Op1 | Op0 | Op1 | TID_A4 | TID_A3 | TID_A2 | TID_A1 | TID_A0 | ~772 |

*FIG. 7C*

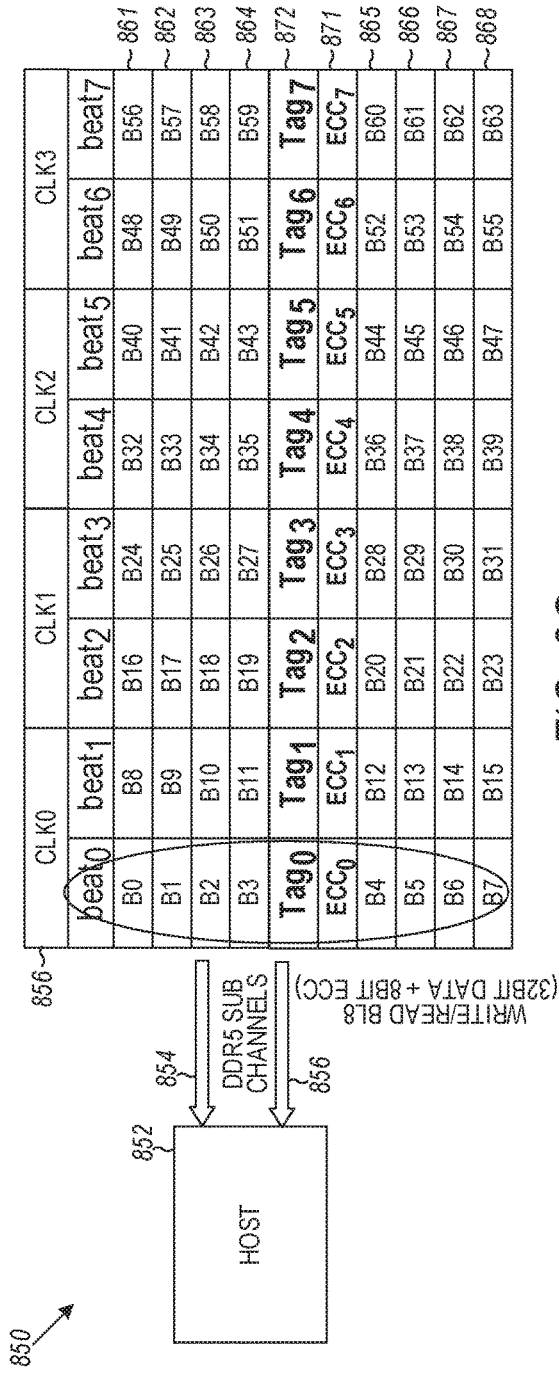

VERILOG EQUATIONS (COMBINATORIAL LOGICS OF PARALLEL 32BIT CRC16) 892

```
m0 = ^ {D[0],  reg[0]};
m1 = ^ {D[1],  reg[1]};
m2 = ^ {D[2],  reg[2]};
m3 = ^ {D[3],  reg[3]};
m4 = ^ {D[4],  reg[4]};
m5 = ^ {D[5],  reg[5]};
m6 = ^ {D[6],  reg[6]};
m7 = ^ {D[7],  reg[7]};
M0 = ^ {D[8],  reg[8],   m0, m4 };
M1 = ^ {D[9],  reg[9],   m1, m5 };
M2 = ^ {D[10], reg[10],  m2, m6 };
M3 = ^ {D[11], reg[11],  m3, m7, m0};
M4 = ^ {D[12], reg[12],  m1};
M5 = ^ {D[13], reg[13],  m2};
M6 = ^ {D[14], reg[14],  m3};
M7 = ^ {D[15], reg[15],  m4,       m0};

REGISTERS ASSIGNMENT, CRC[15:0] = reg[15:0] CHECK-BITS AFTER 8 BEATS  894

```
reg[0]  <= ^{n0, n5, n1,  N0, N4};      reg[8]  <= ^{ N0, N5, N1};
reg[1]  <= ^{n1, n6, n2,  N1, N5};      reg[9]  <= ^{ N1, N6, N2};
reg[2]  <= ^{n2, n7, n3,  N2, N6};      reg[10] <= ^{ N2, N7, N3};
reg[3]  <= ^{n3,          N3, N7, N0};  reg[11] <= ^{ N3          };
reg[4]  <= ^{n4,     n0,  N1};          reg[12] <= ^{ N4,     N0};
reg[5]  <= ^{n5,     n1,  N2};          reg[13] <= ^{ N5,     N1};
reg[6]  <= ^{n6,     n2,  N3};          reg[14] <= ^{ N6,     N2};
reg[7]  <= ^{n7,     n3,  N4,     N0};  reg[15] <= ^{ N7,     N3};
```

FIG. 8G

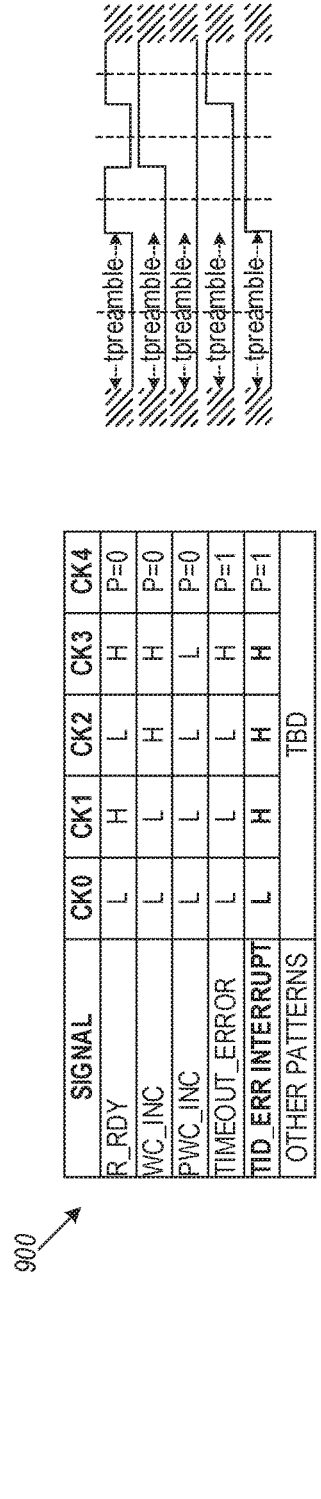

| SIGNAL | CK0 | CK1 | CK2 | CK3 | CK4 |
|---|---|---|---|---|---|
| R_RDY | L | H | L | H | P=0 |
| MC_INC | L | L | H | L | P=0 |
| PWC_INC | L | L | L | L | P=0 |
| TIMEOUT_ERROR | L | L | L | H | P=1 |
| TID ERR INTERRUPT | L | H | H | H | P=1 |
| OTHER PATTERNS | | | | | TBD |

| FUNCTION | CS_n | ACT_n | RAS_n/ A16 | CAS_n/ A15 | WE_n/ A14 | BG [1:0] | BA [1:0] | C [2:0] | A17 | A12/ BC_n | A13 | A12/ AP | A[9:0] |
|---|---|---|---|---|---|---|---|---|---|---|---|---|---|
| SEND | L | H | H | L | H | OP CODE | | TID[13:10] | PAR | ONE/ALL | H | PRIORITY | TID |

| OP-CODE | FUNCTION | A[9:0] FIELD |
|---|---|---|
| 0001 | Set TID Counter to a value carried in the A[9:0] field | Initializes a NVDIMM TID |
| 0010 | Fetches a "Number" of TIDs from Latest TID registers for diagnosing TID errors | Host fetch the latest TIDs |
| 0011 | Send a synch TID to DIMM periodically, without data fetch | Next TID for periodic synch |
| 0100 | Fetches 64B data and carries the next TID for DIMM TID counter to synch | Next TID as fetch read data |
| 0101 | Fetches 64B from buffer and set a future skipped TID to guide DIMM TID counter | Next skipped TID |
| 0110 | Fetches 64B from NVDIMM-P buffer with a particular RID as host detected CRC error | RID of fetched data w/ error |
| 0111 | Persistent Write Confirmed by fetching the latest PWID on the DDR data bus | RFU |
| 1111 | Original normal X_SEND command to fetch 64B from READ ready buffer | RFU |

| FUNCTION | CS-n | ACT_n | RAS_n/ A16 | CAS_n/ A15 | WE_n/ A14 | BG [1:0] | BA [1:0] | C [2:0] | A17 | A12/ BC_n | A13 | A11 | A10/AP | A[9:0] |
|---|---|---|---|---|---|---|---|---|---|---|---|---|---|---|
| ACTIVATE | L | L | ROW ADDRESS | | | | | | | | ROW ADDRESS | | | |
| X-READ | L | H | H | L | H | EXTENDED ADDRESS | | V | CL[1] | PAR | PF[1] | L | PF[0] | CA |
| SEND | L | H | H | L | H | OP CODE[2] | BA | TID[13:10][3] | PAR | ONE/ ALL | H | PRIORITY | TID |
| | | | | | | | | ECC[4:0][3] | | | | | | VC-P |
| | | | | | | | | | | | | | | NUMBER |
| X-WRITE | L | H | H | L | L | EXTENDED ADDRESS | | | CL[1] | PAR | RFU | L | PRIORITY | CA |
| X-PWRITE | L | H | H | L | L | EXTENDED ADDRESS | | | CL[1] | PAR | L | H | PRIORITY | CA |
| COMMIT | L | H | H | L | L | SEQ.COUNT [7:0] | | | | PAR | H | H | PRIORITY | CA |
| | | | | | | RFU | | | | | | | | |

TRANSACTION IDENTIFICATION SYNCHRONIZATION

FIELD OF THE INVENTION

The present disclosure is related to methods and apparatus using memory devices.

BACKGROUND

For nondeterministic transaction requests over a double data rate (DDR) memory channel such as a DDR4 or DDR5 bus, the host and the device controller on the memory side have to assign proper transaction identifications (TIDs) for a host to identify which requests respond to the host with completed data or completion status at a time later than the previously issued transaction requests. To synchronize the device TID assignment or TID generator with the host side TID generator without additional bus resource or to embed or hide TID synchronizations within existing bus traffics, becomes a challenge. For writing data, to embed TID information of the write transaction into current cyclic redundancy check (CRC) bytes of a DDR4 (fourth-generation double data rate memory device) can make total channel overhead as high as 40.625% from 12.5%. For reading data, it would be too late for the host to find errors in a received TID. The TID should be synced to the received read request. Current proposals for a non-volatile dual in-line memory module for persistent memory (NVDIMM-P) also include reporting TID error by read data's error-correcting code (ECC) as interrupt to the host and using three handshaking pins as shared feedback error message bus. Enhancements are needed to address operations of a host and memory module to efficiently handle identification of transactions between the host and memory module.

SUMMARY

A communication method, for communication between a host and a memory controller, comprises generating, at the host, a transaction identification (TID) for a transaction using an incremental counter, and generating a parity bit from parity of the TID and parity of a transaction command and data address for the transaction. The parity bit is compared to a parity bit sequences pattern and the parity bit is forced to match the parity bit sequences pattern, and the matching parity bit is set to a host parity bit. The host parity bit along with the transaction command and data address are transmitted from the host to the memory controller of a memory module. Bits to specify a write transaction identification (WID) of a write transaction are embedded, by the host, into error correcting codes (ECCs) of write data and the write data with the ECCs is transmitted to the memory controller for transmission through a noisy memory channel with more errors. A generated transaction command is reconstructed and/or retransmitted by the host after detecting a received TID with error caused by noise of the noisy memory channel.

A communication method, for communication between a host and a memory controller, comprises generating, at the memory controller of a memory module, a transaction identification (TID) for a received transaction using an incremental counter; generating a parity bit from parity of the generated TID and parity of a transaction command and data address of the received transaction; and comparing the parity bit to a parity bit sequences pattern. A host parity bit along with the transaction command and data address of the received transaction is received from a host; and the parity bit is compared to the host parity bit. A read transaction identification (RID) of a read transaction with ECCs/cyclic redundancy check (CRC) codes by the memory controller is inserted into a read response and transmitting the read response to the host.

A host, to execute transactions with a memory module, comprises an incremental counter, a parity generator, a host comparison module, and a communication node. The incremental counter is structured to generate a transaction identification, and the parity generator is structured to generate a parity bit from a combination of the transaction identification and command and data address bits. A host comparison module is structured to force the parity bit to match a running parity pattern and set a host parity bit to match the running parity pattern, and a communication node is structured to transmit the host parity to a memory controller of the memory module to synchronize the transaction identification with a transaction identification of the memory controller.

A memory module comprises a memory controller, a incremental counter, a parity generator, and communication nodes. The incremental counter is structured to generate a transaction identification and the parity generator is structured to generate a parity bit from a combination of the transaction identification and command and data address bits. The communication nodes are structured to receive a host parity bit and the command and data address bits from a host to synchronize the transaction identification between the memory controller and the host.

Various examples are now described to introduce a selection of concepts in a simplified form that are further described below in the detailed description. The Summary is not intended to identify key or essential features of the claimed subject matter, nor is it intended to be used to limit the scope of the claimed subject matter.

In an example 1, a communication method, for communication between a host and a memory controller, comprises: generating, at the host, a transaction identification (TID) for a transaction using an incremental counter; generating a parity bit from parity of the TID and parity of a transaction command and data address for the transaction; comparing the parity bit to a parity bit sequences pattern and forcing the parity bit to match the parity bit sequences pattern; setting the matching parity bit to a host parity bit; transmitting the host parity bit along with the transaction command and data address from the host to the memory controller of a memory module; embedding, by the host, bits to specify a write transaction identification (WID) of a write transaction into error correcting codes (ECCs) of write data and transmitting the write data with the ECCs to the memory controller for transmission through a noisy memory channel with more errors; and reconstructing and/or retransmitting a generated transaction command by the host after detecting a received TID with error caused by noise of the noisy memory channel.

In an example 2, a communication method includes elements of example 1 and can include transmitting the host parity bit along with the transaction command and data address to include transmitting the host parity bit along with the transaction command and data address to the memory controller from the host over a single data rate (SDR) command/address bus.

In an example 3, a communication method includes elements of examples 1 and 2 and can include generating, at the host, an initialization TID; and sending, from the host, the initialization TID in a SEND command to the memory controller to setup an incremental counter of the memory controller synchronized to the initialization TID.

In an example 4, a communication method includes elements of examples 1-3 and can include embedding the bits for the WID or bits for a write persistent memory transaction identification (PWID) of a persistent memory (PM) write transaction into the ECC codes of data corresponding to a XWRITE command of the write transaction or a XPWRITE command of the PM write transaction at the host by: assigning a validated count number to be the WID or the PWID by the incremental counter at the host; calculating 8 bytes ECC codes from combination of the data corresponding to the XWRITE command or the XPWRITE command, with two bits (op[1:0]) of operational codes and the bits (TID[Δ4:Δ0]) for the WID or the PWID, beat-by-beat; and transmitting the data including the 8 bytes ECC codes to the controller of the memory module without the WID or the PWID.

In an example 5, a communication method includes elements of examples 1-4 and can include transmitting the data beat-by-beat includes transmitting 64 bits data, 8 bits Tag, and 8 bits ECC thru a fifth generation double data rate (DDR5) data channel, 6 bits command/address (C/A) thru a C/A control bus, with op[1:0] and TID[Δ4:Δ0] not being transferred.

In an example 6, a communication method includes elements of examples 1-5 and can include with respect to a SEND data and ECC carrying a RID of a read data burst of ready read data over a double data rate (DDR) bus of a read transaction, the host: receiving the data burst and ECC codes; running a cyclic redundancy check (CRC) code to detect errors; issuing a new SEND command with the same RID to retry fetching the ready read data if the host detected CRC error; and closing the read transaction with success status if the host detects no CRC error, and then delivering the data burst to an associated central processing unit (CPU) core.

In an example 7, a communication method, for communication between a host and a memory controller, comprises: generating, at the memory controller of a memory module, a transaction identification (TID) for a received transaction using an incremental counter; generating a parity bit from parity of the generated TID and parity of a transaction command and data address of the received transaction; comparing the parity bit to a parity bit sequences pattern; receiving a host parity bit along with the transaction command and data address of the received transaction from a host; comparing the parity bit to the host parity bit; and inserting a read transaction identification (RID) of a read transaction with ECCs/cyclic redundancy check (CRC) codes by the memory controller into a read response and transmitting the read response to the host.

In an example 8, a communication method includes elements of example 7 and can include, at the memory controller of the memory module: receiving, from the host, a host parity bit, command bits, and data address bits over a single data rate (SDR) command/address bus; verifying whether the received host parity bit matches with a running parity sequence pattern; if parity error is detected, interrupting the host, by an asynchronous response signal additional to a double data rate (DDR) bus alert signal, to reconstruct and/or retransmit the transaction command and data address; generating a count number using the incremental counter of the memory module; skipping the count number upon determination that the count number is being used by an outstanding transaction identification; generating a parity bit of a combination of bits of the count number and the received command bits and data address bits from the host; comparing the generated parity bit with the host parity bit; in an iterative procedure, if the generated parity bit is not equal to received host parity bit, incrementing the count number and regenerating a parity bit from a combination of bits of the incremented count number and the received command bits and data address bits from the host, until the regenerated parity bit equals to the host parity bit providing the incremented count number as a validated number; and assigning the validated number to be the TID and executing the associated transaction command with the data address.

In an example 9, a communication method includes elements of examples 7 and 8 and can include, with respect to bits for a write transaction identification (WID) of a write transaction or a persistent memory write transaction identification (PWID) for a persistent memory (PM) write transaction embedded into the ECC codes of data corresponding to a XWRITE command of the write transaction or a XPWRITE command of the PM write transaction at the host, at the controller of the memory module: receiving, from the host, the XWRITE command or the XPWRITE command and corresponding data address from a single data rate (SDR) command/address bus with a data burst from a double data rate (DDR) bus including the ECC codes corresponding to the XWRITE command or the XPWRITE command; extracting or regenerating the bits for the WID or the PWID from the parity, command, and address bits; using an ECC decoder to correct a one bit error in the data burst and to double check whether the error is located in two bits of operation code or in the bits for the WID or PWID, where the WID or PWID is one of a full TID number, two repeated differences of consecutive WIDs or PWIDs, or a TID synchronization number, and extracting 2 bits op-codes by bit-flipping trials; interrupting the host by an asynchronous response signal to reconstruct and/or retransmit the XWRITE command or the XPWRITE command if uncorrectable errors were detected in the data burst or two bits of operation code or in the bits for the WID or PWID by the ECC decoder at the at the controller of the memory module; and executing the XWRITE command or the XPWRITE command with data address and data burst upon no detection of error.

In an example 10, a communication method includes elements of examples 7-9 and can include using 8 bytes of ECC codes of SEND data in protection of a responding read transaction data burst from the controller of the memory module to the host over a double data rate (DDR) bus, the error-correcting code being replaced by a cyclic redundancy check (CRC) code to protect 64 bit data, an 8 bit operational code, and 14 bits RID, plus 14 bits message, 16 bits metadata, and CRC bits spread within 8 bytes of the ECC provided as 8 bursts, using multiple parallel CRC computation modules with condensed CRC check bits to reduce computation latency and probability of undetected errors.

In an example 11, a communication method includes elements of examples 7-10 and can include generating an error alert to handle a TID error and communicating, to the host from the memory controller, a number of TIDs used in previous synchronizations between the host and the controller of the memory module.

In an example 12, a host, to execute transactions with a memory module, comprises: an incremental counter to generate a transaction identification; a parity generator to generate a parity bit from a combination of the transaction identification and command and data address bits; a host comparison module to force the parity bit to match a running parity pattern and set a host parity bit to match the running parity pattern; and a communication node to transmit the host parity to a memory controller of the memory module to synchronize the transaction identification with a transaction identification of the memory controller.

In an example 13, a host includes elements of example 12 and can include the incremental counter arranged to generate a count as a proposed transaction identification, the host including a comparison module to determine whether the count equals an outstanding transaction identification.

In an example 14, a host includes elements of examples 12 and 13 and can include the host arranged to embed a host transaction identification number in a read command and transmit the read command to the memory controller, the host transaction identification number being an initialization of a transaction identification generator of the controller of the memory module.

In an example 15, a host includes elements of examples 12-14 and can include an error-correcting code generator, the error-correcting code generator arranged to calculate an error-correcting code from combination of data corresponding to a write command, an operational code, and bits for the transaction identification generated as a write transaction identification, the communication nodes arranged to transmit the data including the error-correcting code to the memory controller.

In an example 16, a host includes elements of examples 12-15 and can include the host arranged to generate a request for a number of transaction identifications used in previous synchronizations between the host and the memory controller in response to an error alert from the memory controller.

In an example 17, a memory module comprises: a memory controller; a incremental counter to generate a transaction identification; a parity generator to generate a parity bit from a combination of the transaction identification and command and data address bits; and communication nodes to receive a host parity bit and the command and data address bits from a host to synchronize the transaction identification between the memory controller and the host.

In an example 18, a memory module includes elements of example 17 and can include a comparison module arranged to compare the generated transaction identification to a list of outstanding transaction identifications and to compare the generated parity bit to a running parity pattern.

In an example 19, a memory module includes elements of examples 17 and 18 and can include an error-correcting code generator, the error-correcting code generator to calculate an error-correcting code for data, corresponding to a read command, from a combination including the data, an operational code, and a message, the communication nodes to transmit the data including the error-correcting code from the memory controller to the host.

BRIEF DESCRIPTION OF THE DRAWINGS

FIG. 4A is an example illustrating a running parity of a transaction identification generation scheme with respect to a memory module, according to an example embodiment.

FIG. 4B is an example of a running parity error detection truth table, according to an example embodiment.

FIG. 7A is an illustration of an example eight bit error correcting code of a write burst that can carry its transaction identification without transfer of the transaction identification, according to an example embodiment.

FIG. 7B is a truth table of operational codes, according to an example embodiment.

FIG. 7C is an illustration of an example for eight bytes error correcting code to protect a write data burst and a command/address with an embedded transaction identification and eight bytes of tags for an arrangement of a non-volatile dual in-line memory module for persistent memory with fifth-generation double data rate memories, according to an example embodiment.

FIG. 8C is an illustration of an example of read transaction data bursts protected by eight byte of error-correcting code with a second sub-channel of error-correcting code changed as tag bytes, according to an example embodiment.

FIG. 8D is an illustration of an example of transaction data with write transaction identification or read identification or plus eight bytes of extra tag and other informational bits protected by a sixteen bit cyclic redundancy check code method for a non-volatile dual in-line memory module for persistent memory with fifth-generation double data rate memories in the example of FIG. 8C, according to an example embodiment.

FIGS. 8E-G are an illustration of a fast CRC-16 calculator by 3 of CRC-16 modules to separately compute the up 32 bit of data, the low 32 bit data, the 16 bit of Tag and TID/Metadata by parallel CRC-16 combinatorial exclusive- or logics beat-by-beat to generate $ECC_6$ and $ECC_7$ bytes in the FIG. 8B or FIG. 8D, according to an example embodiment.

FIG. 9 is an example illustrating an asynchronous interrupt signal encoding table, according to an example embodiment.

FIG. 10 is an example of a data structure of a SEND command extended definition, according to an example embodiment.

FIG. 11 is an example of a data structure of an example extended transaction command definitions of a protocol for a non-volatile dual in-line memory module for persistent memory with fifth-generation double data rate memories, according to an example embodiment.

DETAILED DESCRIPTION

Figure 1:
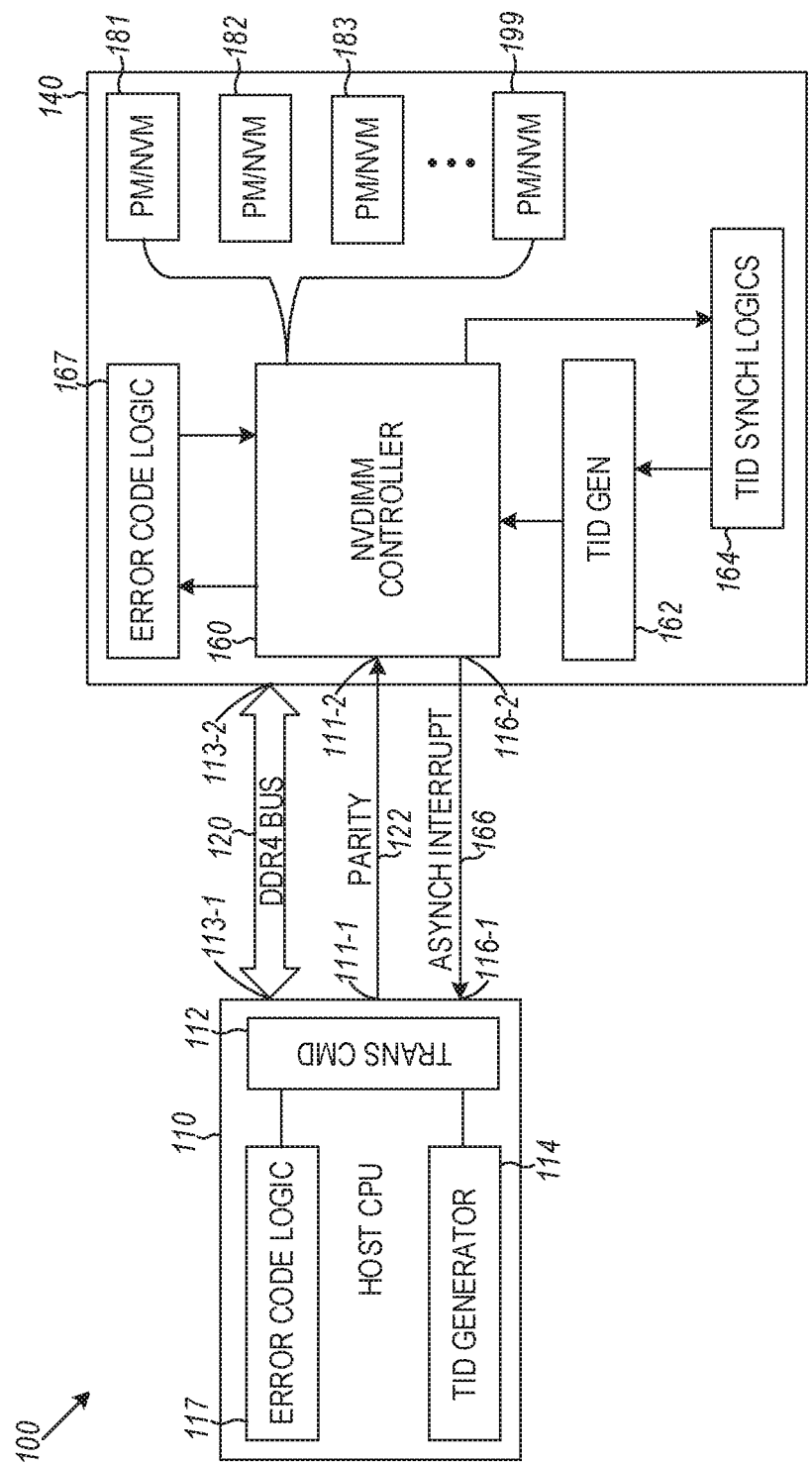
FIG. 1 is a schematic representation of an arrangement of a host and a controller of a memory module, according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Some portions of the detailed descriptions which follow are presented in terms of procedures, steps, logic blocks, processing, and other symbolic representations of operations on data bits that can be performed on memory devices. These descriptions and representations are the means used by those skilled in the data processing arts and processing apparatus arts to most effectively convey the substance of their work to others skilled in the art. A procedure, computer generated step, logic block, process, etc., is herein, and generally, conceived to be a self-consistent sequence of steps or instructions leading to a desired result. The steps are those requiring physical manipulations of physical quantities. These quantities take the form of electrical or magnetic signals or orientation of elemental physical structures that are capable of being correlated to being stored, transferred, combined, compared, and otherwise manipulated in components of a host, memory modules, and/or memory devices. It has proven convenient at times, principally for reasons of common usage, to refer to these physical quantities as signals, bits, values, elements, symbols, characters, terms, numbers, or other similar terms depending on the context of the usage.

In various embodiments, a host and a controller of a memory module can be structured to generate a TID using an incremental counter at both the host and the controller independently and to engage in synchronization of the TID between the host and the controller by a parity bit sequences pattern of a combination of the TID plus transaction command and data address. For such an arrangement, a device TID generator of the controller can be initialized by a SEND command to carry a host TID number in unused bits of the current structure of SEND. The incremental counter can be used in an innovative manner to embed bits of the write transaction identification (WID) by a host into the ECC bytes of data being written to a device on the memory module without really transferring the WID to the controller of the memory module.

The parity bit sequences pattern can be defined as part of a TID generation scheme to have the bus command/address parity bit also covering TID parity and to make the consequent parity bits adhere to certain running pattern. For example, the parity bit sequences pattern may be implemented as a 0101 . . . bit altering sequence. However, other sequences can be implemented in accordance with a selected Markov chain. With an existing one bit parity check used to detect odd number bit errors in command/address bus, the running parity pattern can detect an additional one bit error in the TID number by the Markov chain.

When an error is detected at a memory module, several innovative procedures can be implemented. An interrupt or additional error alert feedback signal can be defined by modifying a current asynchronous response line of a memory module without overhead. When a running parity error is detected at a memory module, an error alert signal can be sent to the host for the host to reconstruct and/or transmit the same transaction command, which reconstruction and/or transmission of the same transaction command force the TID generator at the memory module to regenerate the TID assignment operation. For analysis of an error, the host can generate a command to fetch TIDs from previous transactions from the controller of the memory module to determine when a problem with the TIDs occurred. Such a fetching command can be realized as an existing command for the memory module that is modified to request the previous TIDs. Several more bus commands can be retried, if the single retry by the above method failed to work.

Transaction identification procedures and modifications to command and address structures, as taught herein, provide enhancements to operations of a host and memory modules. A host is an apparatus or device that controls access to data in a memory device and can manage memory devices and modules on which the memory devices are located. A host may be realized as a central processing unit (CPU), a system on a chip (SOC), or other apparatus that provides means for accomplishing the functions of a host that controls and/or manages memory devices. As taught herein, a send command, as used in some conventional systems, can be modified to carry a host TID value. This modified send command allows the host to initialize a TID generator of a memory module, to synchronize the TID generator of a memory module periodically or mark outstanding TIDs, and to assign next read transaction identification as the host requests a controller of the memory module to return ready data from the memory module's read buffers, and other to conduct other activities. Other commands, as used in some conventional systems, can be modified to provide enhancement operational capabilities.

Transaction identification procedures and modifications, as taught herein, include a monitoring scheme in which a parity bit of command and address along with a generated TID provide a synchronization chaining pattern between the TID generator of the host and the TID generator of the memory module to force TID of the memory module to be synchronized or locked to the TID of the host. Such transaction identification procedures and modifications provide a straight forward mechanism to allow skipping outstanding TIDs to avoid conflicting with ongoing unfinished transactions to which the outstanding TIDs are assigned before counter swapped/overflowed to 0 from its max value. In addition, ECC bytes of a write transaction data can implicitly carry the WID of the current write transaction. Other enhancements can include use of a fixed length asynchronous signal pattern for TID error alert by the controller that can lead to simplified hardware design to carry more interrupt signals.

FIG. 1 is a block diagram of an embodiment of an arrangement 100 of a host and a controller of a memory module. In this example, a CPU 110 is arranged with a non-volatile dual in-line memory module for persistent memory (NVDIMM-P) 140. Host CPU 110 can include a transaction command generator 112 and a TID generator 114. Host CPU 110 includes conventional components to initiate and manage access to and from data memories including error code logic 117 for coding and decoding error techniques such as ECC, CRC, reissuing transaction requests with error and other standard error techniques. NVDIMM-P 140 can include a number of persistent memory or non-volatile memories PM/NVM 181, PM/NVM 182, PM/NVM 183 . . . PM/NVM 199 controlled by a NVDIMM controller 160. NVDIMM controller 160 can be coupled with a TID generator 162 on NVDIMM-P 140 and with TID synch logics 164 to operate a TID synchronization with the host CPU 110. NVDIMM controller 160 can be coupled with error code logic 167 for coding and decoding error techniques such as ECC, CRC, and other standard error techniques. A bus for fourth-generation double data rate memories, DDR4 bus 120, can transmit data between communication node 113-1 of the host CPU 110 and communication node 113-2 of NVDIMM controller 160. A parity line 122 can be implemented to transmit a parity bit from a communication node 111-1 of host CPU 110 to a communication node 111-2 of NVDIMM controller 160. An asynchronous interrupt line 166 can be coupled between a communication node 116-2 of NVDIMM controller 160 and a communication node 116-1 of host CPU 110.

A one bit parity can be used to synch on-DIMM TID generator 162 with host TID generator 114 for a transaction command, having an associated TID, transmitted to NVDIMM-P device such as NVDIMM controller 160. Host CPU 110 issues transaction commands to the NVDIMM controller 160 for accessing PM/NVM 181, PM/NVM 182, PM/NVM 183 . . . PM/NVM 199 on the NVDIMM-P 140, where each transaction command has an individual TID assigned to it. The local TID of each transaction command in NVDIMM controller 160 is to be synched with the TID in host CPU 160 for the same transaction command A TID can be assigned as a write transaction identification (WID) or a read transaction identification (RID) or a persistent memory (PM) write transaction identification (PWID).

Figure 2:
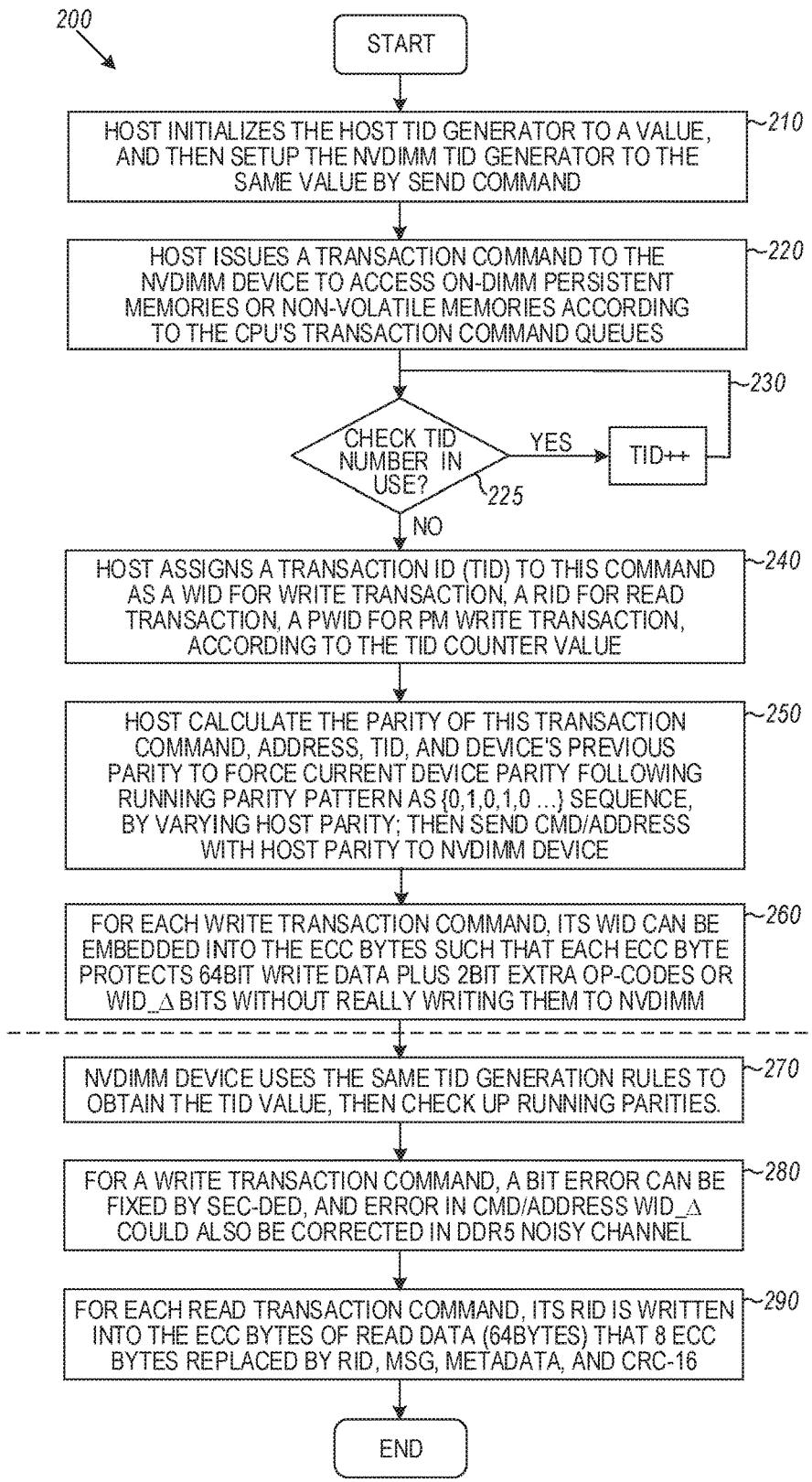
FIG. 2 is a flow diagram of features of example procedures of transaction identification generation and initialization, according to an example embodiment.

FIG. 2 is a flow diagram 200 of features of an embodiment of example procedures of TID generation and initialization. In this example, a host is arranged with a NVDIMM device, for example a NVDIMM controller, on a NVDIMM that can include fifth-generation double data rate memories, DDR5, in an arrangement similar to arrangement 100 of FIG. 1. At 210, a host initializes the host TID generator to an available value, and then sets up the NVDIMM TID generator to the same value by a SEND command, to synch-up NVDIMM TID generator to the host TID. At 220, the host issues a transaction command to the NVDIMM device to access on-DIMM PMs or NVMs according to the host CPU's transaction command queues. At 225, a check is made to determine if the TID number is in use. If the currently generated TID number is in issue, at 230, the TID number is incremented and another check is made as to whether the new number is also in use, until found an available TID number.

At 240, the host assigns a TID to the current command as a WID for a write transaction, a RID for a read transaction, or a PWID for a PM write transaction, according to the TID counter value, in response to the determination that the TID counter value is not currently in issue with respect to another transaction. At 250, the host calculates the parity of this transaction command, address, TID, and device's previous parity to force current device parity to follow running parity pattern as a {0, 1, 0, 1, 0 . . . } sequence for example, by varying host parity. The host then sends the command and address with the host parity to the NVDIMM device. At 260, for each write transaction command, bits for its WID can be embedded into the ECC bytes such that each ECC byte protects 64 bits of write transaction data plus two extra bits for operational codes or bits without actually writing the operational codes and WID_Δ bits to the NVDIMM. With a TID previously set by using the SEND command, a number of counts can be used to identify a WID. TID_Δ=0 immediately after the initialized TID value by the SEND command. The TID_Δ equal to 1, which is usually expected, the WID can be sent to the current TID+1. The TID_Δ can be equal to skipped number of consecutive outstanding TIDs. If host determines that the skipped consecutive outstanding TIDs are more than 31 (5 bit), host can use SEND command to initialize the controller's TID counter to the ahead available TID value.

In FIG. 2, there is a dotted line in the presentation of the procedures illustrated by flow diagram 200. This dotted line provides a demarcation between actions taken at the host and actions taken at the NVDIMM device. Above the dotted line are actions taken by the host, and below the dotted line are actions taken by the NVDIMM device. At 270, the NVDIMM device uses the same TID generation rules, as the host, to obtain the TID value for the received transaction command, and then checks the running parities. At 280, for a write transaction command, a bit error can be fixed by single error correction, double error detection (SEC-DED) method, and error in cmd/address WID associated with a DDR5 noisy channel can also be corrected. At 290, for each read transaction fetched data, the data RID can be carried in the ECC bytes of read data (64 bytes), where eight ECC bytes are replaced by the RID, a message, metadata, and a 16-bit cyclic redundancy check (CRC-16). A CRC-16 is an error-detecting code to cover multiple errors in data and RID and extra information bits.

Figure 3:
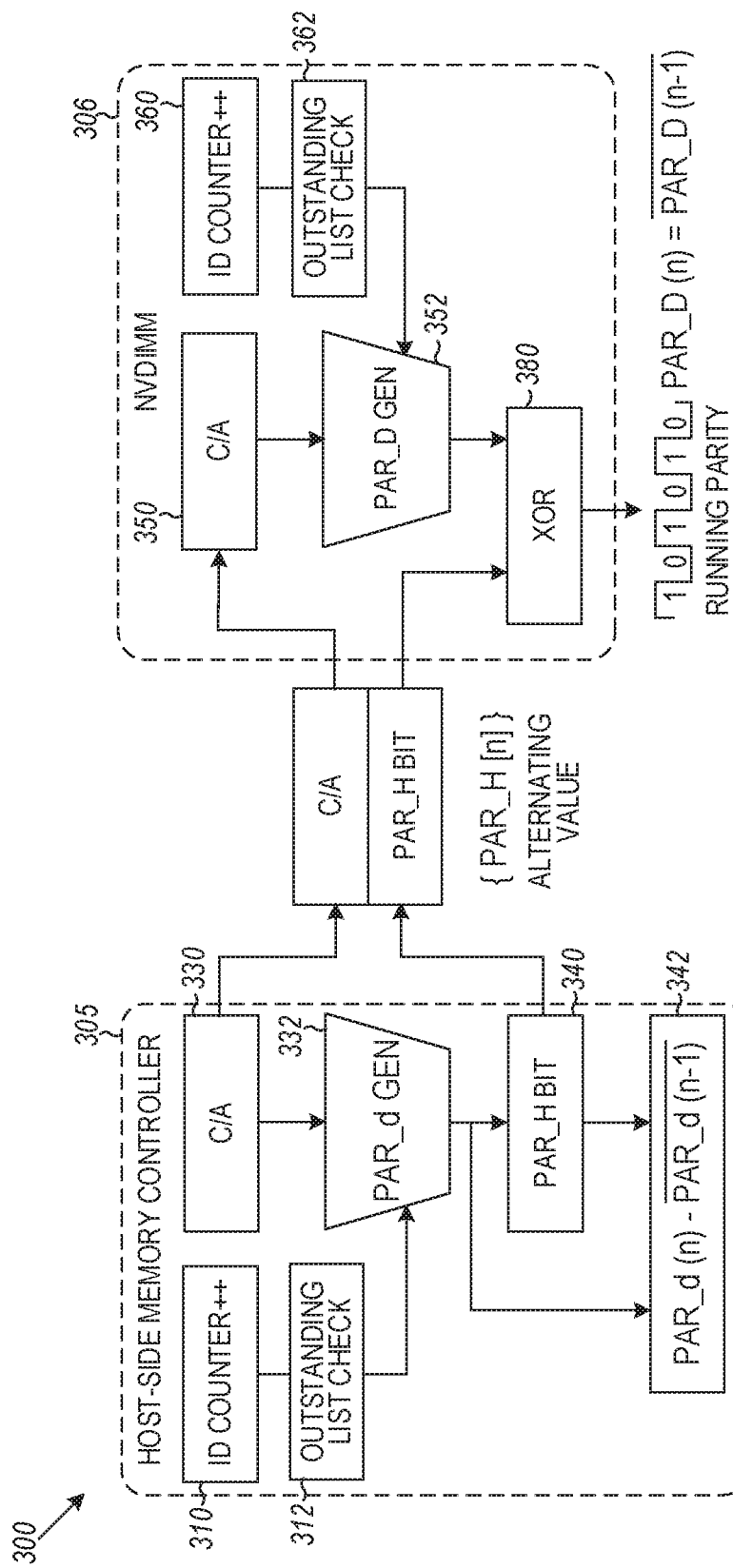
FIG. 3 is a schematic representation of an arrangement of a host and a controller of a memory module to embed a transaction identification by one bit running parities without transferring the transaction identification, according to an example embodiment.

FIG. 3 is a block diagram of an embodiment of an arrangement 300 of a host and a controller of a memory module to embed a TID by one bit running parities without transferring the TID. In this example, arrangement 300 includes a host-side memory controller 305 arranged with a NVDIMM 306. Host-side memory controller 305 can include a TID incremental counter 310, an outstanding list check 312, a command and address (C/A) generator 330, a host parity generator 332, and a host comparison module 342 to provide a host parity bit 340 along with C/A bits from communication nodes of host-side memory controller 305 to communication nodes of NVDIMM 306.

NVDIMM 306 can include a C/A register 350, a TID incremental counter 360, an outstanding list check 362, and a NVDIMM parity generator 352 to provide a parity bit to compare with host parity bit 340 received from host-side memory controller 305 using a comparator 380. NVDIMM 306 can include a comparison module to determine if the parity bit generated by NVDIMM parity generator 352 satisfies a running parity sequence such as 1 0 1 0 1 0 . . . or other selected Markov chain. The comparison module in NVDIMM 306 can be integrated in comparator 380, NVDIMM parity generator 352, distributed in components of NVDIMM 306, or as a standalone component of NVDIMM 306.

For a current request, C/A generator 330 of host-side memory controller generates command and data address bits, and TID incremental counter 310 can generate a count number. The count number can be compared with outstanding list check 312 to determine if the count number is a TID of an outstanding transaction. If the count number is not an outstanding TID, the parity of a combination of the count number and bits of the current command and data address can be generated by host parity generator 332. The current generated host parity, PAR_H (n), can be compared to a selected running parity sequence pattern. For a running parity sequence pattern at controller PAR_d[n] that alternates between 0 and 1, PAR_H (n) could be flipped to meet, $$PAR\_d(n) = \overline{PAR\_d(n-1)}.$$

The host parity PAR_H[n], which satisfies the running parity sequence pattern and check of outstanding TIDs, is sent to NVDIMM 306 as the current host parity bit along with the current command and data address bits.

At NVDIMM 306, the current command and data address bits are received and can be placed in storage such as, but not limited to, C/A register 340 and the host parity PAR_H[n] is received and can be applied to comparator 380, which can be implemented as XOR logic. With reception of the command and data address, TID incremental counter 360 can generate a count number and proceed to generate a TID in a manner similar or identical to the procedures taken in the host-side. The count number can be compared with outstanding list check 362 to determine if the count number is a TID of an outstanding transaction. If the count number is not an outstanding TID, the parity of a combination of the count number and bits of the current command and data address can be generated by NVDIMM parity generator 332, providing parity at the NVDIMM 306 of PAR_D(n). The current generated NVDIMM parity, PAR_D (n), can be compared to a selected running parity sequence pattern. For a running parity sequence pattern that alternates between 0 and 1, PAR_D (n) should be the inverse of the parity of the last transaction (n−1) identified, that is, $$PAR\_D(n) = \overline{PAR\_D(n-1)}.$$

PAR_D (n) was derived from PAR_H(n) in NVDIMM 306 received from host-side TID and sequential parity generator 305. If PAR_D(n) is not associated with an outstanding transaction, satisfies the selected running parity sequence pattern, the TID of host-side memory controller 305 and the TID of NVDIMM 306 are synchronized.

FIG. 4A is an example illustrating an embodiment of a running parity in NVDIMM 306 of TID generation scheme 400. For an alternating pattern of 0 and 1 for the parity bit, note that running parity sequence pattern as:

$$PAR\_d[n] = C/A \text{ parity xor TID parity xor } PAR\_H[n].$$

Scheme 400 illustrates an example of generating TIDs for a set of transaction, where there are outstanding TIDs from previous transactions. In scheme 400, PAR_d sequence is a 1 0 1 0 . . . running pattern for which the PAR_H[n] bit could be flipped to make the current PAR_d[n] parity in the running pattern. In this example, twelve TIDs (TID=column) are generated for twelve transactions (T-cmd [n]) in which the procedures taught with respect to FIGS. 2 and 3 are implemented in sixteen occurrences (step # column). The difference between the number of steps, that is procedures, and the number of TIDs generated is the number of TIDs currently in use, at step #2, 6, and 7 as skipped count value b000010, b000101, b000110. Note that the generation of a TID for the fifth command transmitted used three increments of the TID count, or TID_Δ=3 rather than usually TID_Δ=1, since two of the outstanding TIDs at the procedure for the fifth command were consecutive TIDs.

FIG. 4B is an example of an embodiment of a host PAR_H table 490 derived from running parity PAR_d or controller TID validation table by running parity PAR_D. In the example of truth table 490, four entries 410, 420, 430, and 440 are shown for four transactions in which the transactions passed parity examinations. This example, the parity sequence {0, 1, 0, 1 . . . } was selected, though other parity sequences can be used. Truth table 490 shows each parity bit PAR_H[n] generated at the host equal to the current parity PAR_d[n] or inverse of PAR_d[n] respected with the C/A parity equal to TID parity or not. Truth table 490 also can be used by controller to validate regenerated TID value by parity PAR_D running sequence examination, within this table PAR_d sequence is PAR_D derived from exclusive-or C/A bits and TID bits where the PAR_H bit included in the C/A bits.

Figures 5, 6:
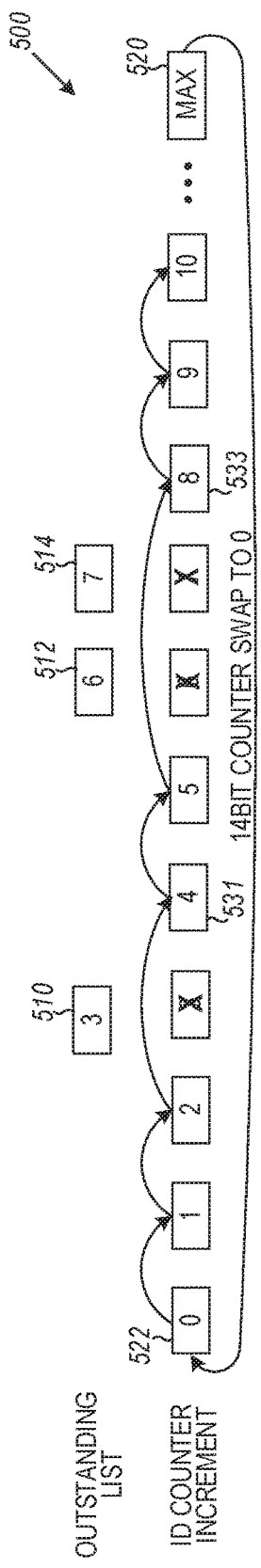
FIG. 5 is an example illustrating operation of a transaction identification counter skipping counts assigned to outstanding transaction identifications, according to an example embodiment.
FIG. 6 is an example of a data structure of a SEND command extended definition, according to an example embodiment.

FIG. 5 is an example illustrating an embodiment of an operation 500 of a TID counter skipping counts assigned to outstanding transaction identifications. In this example, an incremental counter for the TID counter is operable to count from a start 522 to a maximum 520. Start 522 can be set at zero and maximum 520 can be set by the number of bits used for the TID counter. For the example shown, the TID counter is a 14 bit counter {0~16383}. As each transaction command is generated, the TID counter is used to assign a TID for the transaction command starting from zero and incrementing the TID assigned to each new transaction command. If the count number of the counter is currently assigned to an outstanding transaction command, the counter effectively skips this assigned number and assigns the next available number in the incremental counting procedure. In the example shown in FIG. 5, transaction commands 510, 512, and 514 are outstanding and are assigned the TIDs 3, 6, and 7, respectively. As new transaction commands are generated, the TID counter provides the counter number for the TID, but skips the count numbers 3, 6, and 7 and uses next counts for transaction commands 531 and 533. After the TID counter increment reaches the maximum of the counter or a selected maximum, the TID counter is swapped to zero and the next transaction commands are assigned previously used count numbers, starting from zero, that are not currently assigned to outstanding transactions.

A simple counter can be used to generate possible TIDs. As this counter reaches a maximum value, for example 16383 (by a 14 bit counter), it restarts from 0. Each counter value has to be checked against the outstanding TIDs: skip counter value if it is in use by an unfinished request, such as an outstanding TID (for example, the set of TIDs {3, 6, 7} are not allowed as a new TID in the example of FIG. 5); and allocate a TID to incoming request with a buffer for XREAD or XWRITE commands as RID=TID or WID=TID, or PWID=TID without a buffer.

In various embodiments, a TID synchronization scheme between a host and a DIMM can use simple TID counters in the host and the DIMM. The host can issue a fetch command such as a SEND with a specified operation code to setup the TID counter of the DIMM equal to the TID of the host carried in the SEND. Subsequently, for each SEND issued by the host with another specific code, each such SEND can fetch ready data and can carry a next TID to force the TID counter of the DIMM to synch with the TID carried with the current SEND with this code. For every generation of a number of transaction commands, without a SEND command to fetch ready data and can carry a next TID in between any one of the number of transactions commands, the host can issue a SEND command with yet another operation code that sends a next TID to synch the TID counter of the DIMM, without fetching data. The number of transaction commands to initiate the sync without fetching data may be set to sixteen transaction commands. The number may be set to more or less than sixteen transaction commands.

If the DIMM detects its TID lost synch with the host carried TID, the DIMM can alert the host with a TID error interrupt signal. Then, the host can issue a SEND with a specific operational code to fetch 64 bytes of TIDs to figure out where the lost synch TID happened. The host can issue a SEND with op code to initialize the TID counter of the DIMM to a TID carried in this SEND and perform error recovery procedures. In addition, if SEND commands are back-to-back consecutively or very dense in the number sent to the DIMM, the host can issue a SEND with a specific operational code to fetch data and carry a future skipping TID to guide the TID counter of the DIMM. The host can also use a SEND with a specific code that allows the DIMM to set its counter to a value that skips a number of increments from its current setting or from another TID value. Use of a specified set of operational codes allows use of current host and DIMM devices with limited modifications to their operational structure.

FIG. 6 is an example of an embodiment of a data structure 600 of a SEND command extended definition. A current SEND command for some memories includes bit locations reserved for future use. These bit/signal locations can be used with respect to TID synchronization. The SEND command of FIG. 6 can be extended to be used to carry a host TID value to initialize a memory module side TID generator, to synch the memory module side TID generator periodically or mark outstanding TIDs, or to assign a next RID as host requests memory module device to return ready data from memory module's read buffer. A host controller can use A[9:0] to set a memory module, for example a NVDIMM, TID counter to a selected TID. A four bit operations code (op code) can be transmitted via the SEND command extended using the bit locations, BG[1:0] and BA[1:0]. Bit locations C[2:0], A17, and A12 can be used for additional transaction identification bits TID[13:10] and parity. TID[13:10] with parity protection can optionally be used to support slow PM/NVM/storage class memory (SCM) media. Data structure 600 of the SEND command includes standard bit/signal locations for CS_n, ACT_n, RAS_n, CAS_n, WE_n, BG, BA, C, BC_n, AP, and A0-A17. CS_n is a chip select; ACT_n is an activation command; RAS_n is a row address strobe input; CAS_n is a column address strobe input; WE_n is a write enable; BG is a bank group; BA is a bank address; C is a chip ID; BC_n is a burst chop; AP is autoprecharge; and A0-A17 are address inputs. These bit locations or data fields can correspond to pins of a memory module. See, for example, JEDEC Standard for DDR4 NVDIMM-N Design Standard (Revision 1.0), JESD248, September 2016 for further discussion of conventional commands, addresses, signals, and pins.

FIG. 7A is an illustration of an example of an embodiment of an eight bit error correcting code of a write data burst that can carry bits for its transaction identification without transferring the transaction identification to the memory module. FIG. 7A illustrates a DDR4 ECC coding to protect 64 bits of data (B0, B1, . . . B7) plus Op0 and Op1 bits for a total of 66 bits of information by Hamming (127, 120) codes with 7 bits to correct a 1 bit error and 1 bit parity to detect 2 bit errors as 8 bits of a SEC-DED ECC method to protect 66 bit payloads information. However, only 64 bit data+8 bit ECC is transferred to the NVDIMM. The additional two bits will be either regenerated by the NVDIMM controller TID counter or flipping the Op[1:0] two bits by the DIMM controller.

Table 700 shows the bytes of data transmitted on each of two beats of each of four clock signals CLK0, CLK1, CLK2, and CLK3 to transmit 64 bytes of data to a memory module, for example a NVDIMM. Bytes B0 . . . B7 are 64 bits of data in $beat_0$ of CLK0, bytes B8 . . . B15 are 64 bits of data in $beat_1$ of CLK0, bytes B16 . . . B23 are 64 bits of data in $beat_2$ of CLK1, bytes B24 . . . B31 are 64 bits of data in $beat_3$ of CLK1, bytes B32 . . . B39 are 64 bits of data in $beat_4$ of CLK2, bytes B40 . . . B47 are 64 bits of data in $beat_5$ of CLK2, bytes B48 . . . B55 are 64 bits of data in $beat_6$ of CLK3, and bytes B56 . . . B63 are 64 bits of data in $beat_7$ of CLK3. Bit locations Op[1:0] of an operational codes and TID[Δ4:Δ0] are 16 extra bits covered by ECC codes. Each $ECC_i$, for 0≤i≤7, are 8 bits of SEC-DED to protect 64 bits of data plus two bits of information. B[7:0], B[15:8], . . . B[63:56] data are written to NVDIMM, but op[1:0] plus TID[Δ4:Δ0] are re-generated by a NVDIMM device three times for bit flipping trials of op[1:0] bits and twice for regenerated TID_Δ bits. The dashed line between the set of data entries 710 . . . 717 including ECC entries 730 and the entries 721 and 722 is an indication that the data and ECC above the dashed line are transmitted to the memory module, while the entries in lines 721 and 722 are regenerated at the memory module.

By a bit flipping trial for the op0 and op1 values in three beats, the bit flipping provides 2:1 or 3:0 voting results to conclude proper op[1:0] decision. For example, the controller generated WID could become a $3^{rd}$ error bit (if it is out synch). Then, the Hamming decoder could get a syndrome=0 to false declaim "no error" case. Therefore, the op[1:0] bits should be repeated 3 times and TID_Δ bits should be calculated ECC twice in different beats to reduce the above false declaim probability. Assume 1-bit error rate is 1e-5, twice for 2-bit error rate=1e-10, three times for 3-bit error rate=1e-15. For example, with op codes sent in two beats, if there are 2-bit errors in 64 bit data and 8 bit ECC, op0 is flipped from 0 to 1, it becomes 2-bit errors or 3-bit errors. The 3-bit errors could be false declaimed as "no error" case. However, with the op0 repeated 3 times, the false declaim "no error" 3 times has a 1e-15 probability. A 2:1 voting can decide the op0 bit is 0 or 1. Note, with the op0 and op1 in three beats, there is only room for 5 bit TID_Δ for repeating 2 times. A SEND command can be used to skip more outstanding TIDs ahead if they are more than 31 consecutive outstanding TIDs.

FIG. 7B is an embodiment of a truth table 740 of operational codes. These op codes can be used with respect to the Table 700 of FIG. 7A. As shown, op code (0,0) can be used for the operation for setting a WID to TID incremented by one, and an offset, TID_Δ, to the next RID. Use of Δ provides a value to the number to TIDs to be skipped. Op code (0,1) can be used for the operation for setting a WID to TID incremented by one, and TID_Δ is synched to use RID. Op code (1,1) can be used for the operation for setting a WID to a previous TID plus embed TID_Δ. Op code (1,0) can be reserved for future use (RFU).

Usually, only Op[1:0]={1,1} is used, TID_Δ=1=b000001 bits (5 bits, no outstanding TID to skip). At the NVDIMM controller, the TID can be generated by the TID counter with the number of outstanding TID to skip. The max number of outstanding TID skip is 31, they also can be calculated twice to reduce the chance for more bit errors. The Op[1:0] can be tried by {1,1} bits first, then by {0,1} bits or {1,0} bits. The ECC for 64 bits and 2 extra bits without transmission add two erasures to the ECC method.

FIG. 7C is an illustration of an example of an embodiment for eight ECC bytes to protect a write data burst and its command/address with an embedded transaction identification and eight bytes of tags for an arrangement of a non-volatile dual in-line memory module for persistent memory with fifth-generation double data rate memories. FIG. 7C illustrates a DDR5 ECC coding in slow data rate (less errors) to detect errors in 64 bits of data plus 8 bits of a Tag, 6 bits of command/address bits, 2 bits of Op[1:0] or TID_Δ information. In a DDR5 case at slow speed, the 64 bits of data can be protected by 8 bits of a SEC-DED ECC method. The second 8 bits of ECC could be used for Tags, and the error bit in the address bus caused by high speed DDR5 signaling can also be corrected by the 8 bit SEC-DED ECC codes.

As with FIG. 7A, table 750 shows the bytes of data, B0-B63 on lines 760-767, along with $ECC_i$, for $0 \le i \le 7$, on line 782 transmitted on each of two beats of each of four clock signals CLK0, CLK1, CLK2, and CLK3 to transmit 64 bytes of data to a memory module, for example a NVDIMM. Also transmitted are $Tag_i$, $0 \le i \le 7$, shown in line 780, where the $Tag_i$ are 8 bits. In addition the entries of table 750 above dotted line are transmitted to the DDR5 NVDIMM-P, while the entries below the dotted line are generated at the memory module.

Entry 770 includes a number of bit values for ACT_n, RA, ACT_h, EA, CA, RAS_n, CAS_n, WE_n, BG, BA, C, which are various commands and addresses. Each column of entry 770 are for 6 bits of these commands and addresses, providing a total of 48 bits for entry 770. As with FIG. 7A, Op[b 1:0] and TID[Δ4:Δ0] shown in lines 721 and 722 are 16 extra bits. Each $ECC_i$, for $0 \le i \le 7$, are 8 bits of SEC-DED to protect the 64 bits of data, the 8 bit $Tag_i$, 6 bits of command and/or addresses, and op codes or TID information.

The bits for B[7:0], B[15:8], . . . B[63:56], and Tag[7:0] data can be written to the NVDIMM by a DDR4 data bus, and the 48 bits of command and/or addresses of entry 770 are written to the NVDIMM by a SDR C/A bus. The op[1:0] and TID[Δ4:Δ0] bits are not transmitted to and written to a NVDIMM device, but are generated in the NVDIMM without transferring through a DDR4 channel.

In an embodiment, the ECC of write data can carry the TID for the write transaction. Calculated parity of a combination of an XWRITE command, address, and counter number from a TID counter can be generated following a running parity scheme, as a selected Markov chain. At each clock beat, ECC can be calculated at a host from 64 bits of write data plus two bits of an op-code and TID bits, for SEC-DED protection. The TID bits are not transmitted by the DDR4 data bus from the host, but are generated from extracting them from the received ECC bytes. The op-code and TID bits may include two bits for the op code and fourteen bits for TID information such as TID0-TID13. In this embodiment, in comparison with FIG. 7A, $ECC_0$ can be calculated from bytes B0 to B7, Op0, and TID6; $ECC_1$ can be calculated from bytes B8 to B15, Op1, and TID7; $ECC_2$ can be calculated from bytes B16 to B23, TID0, and TID8; $ECC_3$ can be calculated from bytes B24 to B31, TID1, and TID9; $ECC_4$ can be calculated from bytes B32 to B39, TID2, and TID10; $ECC_5$ can be calculated from bytes B40 to B47, TID3, and TID11; $ECC_6$ can be calculated from bytes B48 to B55, TID4, and TID12; and $ECC_7$ can be calculated from bytes B56 to B63, TID5, and TID13.

For DDR4 NVDIMM-P applications, the bus speed is lower (currently 1200 MHz SDR C/A bus and 2400 MT/s DDR data bus) than for DDR5 NVDIMM-P application. At this lower speed, the C/A bus has much less chance with error and the 1 bit parity is sufficient for error detection of command and address bits.

For write transactions, there are two cases: (a) normal random writes mixed with random reads, and (b) consecutive writes. Op[1:0]=[11] bits indicates a write transaction with the TID_Δ increment number from previous TID, where max=31 skipping steps. Each 8 bit SEC-DED ECC code protects 64 bit data plus 2 bit extra embedded Op[1:0] or TID[Δ4:Δ0] information, where the 2 bits of extra information were coded twice for bit-flipping trails as an additional erasure bit without really transferring this 1 bit to NVDIMM. At NVDIMM device, its controller generated the incoming TID number and assigned it as WID as it received the command/address. Eighteen clocks later, the DDR4 data with ECC byte is received clock-by-clock. At the first clock, the embedded or missing Op0 and Op1 bits could be bit-flipping trails, [11] bits, [01] bits, or [10] bits to meet the syndrome=0 without error, the syndrome=location of 1 bit error and parity=0 with 1 correctable error, or the syndrome=not location of 64 bit data parity=1 with uncorrectable errors. Assuming the bit error rate is low (less than $10^{-5}$), all the 1 bit extra information is calculated twice for the same clock.

For DDR5 NVDIMM-P applications, the bus speed is higher than DDR4 and address bits are using DDR (much higher that DDR4 SDR C/A bus). As a result, protection of the command and address can be realized by the ECC codes of written data as shown in FIG. 7C. Early DDR5 products are less than or equal to 4400 MT/s, then, 8 bit SEC-DED ECC codes could protect 64 bit data+8 bit tag+6 bit cmd/address+2 bit TID, where the 6 bit cmd and address were transferred to NVDIMM device by the cmd/address control bus, the 64 bit data and the 8 bit tag are transferred to NVDIMM device by DDR5 data bus. The 2 bit Op[1:0] and TID[Δ4:Δ0] are embedded in the ECC without transferring them and are regenerated by the NVDIMM controller. The SEC-DEC ECC codes can use the Hamming (127, 120) scheme and there is not a problem to handle a total of 80 bits of data+tag+cmd and address+Op and TID.

Figures 8A, 8B:
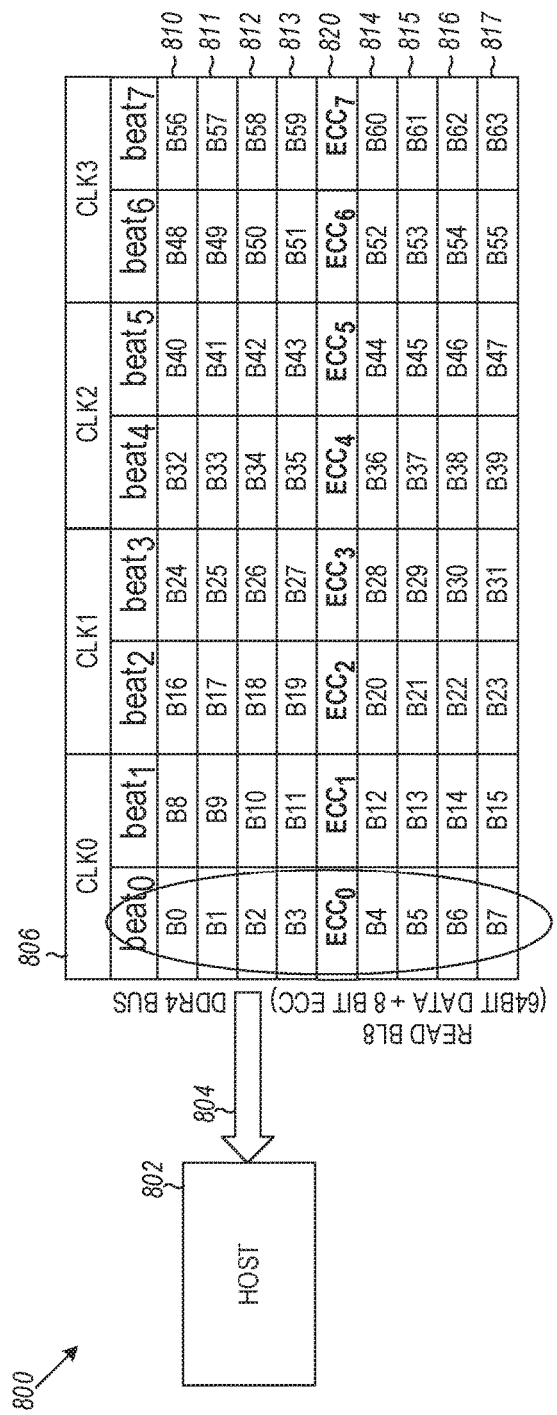
FIG. 8A is an illustration an illustration of an example transfer method of an example read transaction data with a read transaction identification and other information bits protected by an error-correcting code, according to an example embodiment.
FIG. 8B is an illustration of an example of operational codes, read transaction identification, message, metadata, and cyclic redundancy check code to replace an error-correcting code in the example of FIG. 8A, according to an example embodiment.

FIG. 8A is an illustration of an embodiment of an example transfer method 800 of an example read transaction data with a read transaction identification and other information bits carried by an error-correcting code. A host 802 receives read transaction data on a DDR4 bus in a read data burst length of 8 (BL8), where 64 bits of data and 8 bits of ECC are transferred 8 times to the host 802. The transfers can be from a memory module, which is not shown for convenience. Table 806 shows the bytes of data, represented in lines 810-817, transmitted on each of two beats of each of four clock signals CLK0, CLK1, CLK2, and CLK3 to transmit 64 bytes of data to a memory module, for example a NVDIMM. Bytes B0 . . . B7 are 64 bits of data in $beat_0$ of CLK0, bytes B8. B15 are 64 bits of data in $beat_1$ of CLK0, bytes B16 . . . B23 are 64 bits of data in $beat_2$ of CLK1, bytes B24 . . . B31 are 64 bits of data in $beat_3$ of CLK1, bytes B32 . . . B39 are 64 bits of data in $beat_4$ of CLK2, bytes B40 . . . B47 are 64 bits of data in $beat_5$ of CLK2, bytes B48 . . . B55 are 64 bits of data in $beat_6$ of CLK3, and bytes B56 . . . B63 are 64 bits of data in $beat_7$ of CLK3. $ECG_i$, for $0 \le i \le 7$, represented on line 820, transmitted on each of two beats of each of four clock signals CLK0. In method 800, sixty-four bytes of read transaction data bursts are protected by eight bytes of ECC bits.

FIG. 8B is an illustration of an embodiment of an example of ops, RID, message (Msg), metadata (Meta), and cyclic redundancy check code (CRC) to replace 8 bytes of ECC codes in the example of FIG. 8A. Line 820 of FIG. 8A is expanded out as table 821 showing bits replacing the each byte ECG in line 820. ECC[7:0] of line 820 is replaced by op[3:0], RID[13:0], Msg[13:0], Meta[15:0] and CRC error detection codes. The CRC error detection can be a CRC-16 error detection. A CRC-16 algorithm can be implemented using the 16-bit CRC-CCITT (International Telegraph and Telephone Consultative Committee), which is polynomial $x^{16}+x^{12}+x^5+1$, represented as 0×1021. The CRC-16 algorithm can be conducted by the parallel CRC combinatorial exclusive-or logics. The parallel CRC-16 calculation could be much faster and cheaper than the Reed-Solomon ECC method, the host could reissue a SEND command as CRC-16 logics detected errors, especially the multiple random bit errors that could fail the RS-ECC of single symbol error correction method.

FIG. 8C is an illustration of an example transfer method 850 of an embodiment of an example of read transaction data bursts protected by eight bytes of error-correcting code with a second sub-channel of error-correcting code changed as tag bytes for DDR5 dual sub-channels. A host 852 receives read transaction data on a DDR5 sub channels 854 and 856 sub-channels in a write/read BL 8, where two set thirty-two bits of data and 8 bits of ECC are transferred to the host 852. The transfer can be from a memory module, which is not shown for convenience. Table 860 shows the bytes of data, represented in lines 861-864 and 865-868, transmitted on each of two beats of each of four clock signals CLK0, CLK1, CLK2, and CLK3 to transmit 64 bytes of data to a memory module, for example a NVDIMM. Bytes B0 . . . B7 are 64 bits of data in $beat_0$ of CLK0, bytes B8 . . . B15 are 64 bits of data in $beat_1$ of CLK0, bytes B16 . . . B23 are 64 bits of data in $beat_2$ of CLK1, bytes B24 . . . B31 are 64 bits of data in $beat_3$ of CLK1, bytes B32 . . . B39 are 64 bits of data in $beat_4$ of CLK2, bytes B40 . . . B47 are 64 bits of data in $beat_5$ of CLK2, bytes B48 . . . B55 are 64 bits of data in $beat_6$ of CLK3, and bytes B56 . . . B63 are 64 bits of data in $beat_7$ of CLK3. Also transmitted are $Tag_i$, $0 \le i \le 7$, shown in line 872, where the $Tag_i$ are 8 bits. $ECC_i$, for $0 \le i \le 7$, represented on line 871, transmitted on each of two beats of each of four clock signals CLK0. In method 800, sixty-four bytes of read transaction data bursts are protected by eight bytes of ECC codes, the second sub-channel ECC used as Tag bytes.

FIG. 8D is an illustration of an embodiment of an example of 8 bytes ECC [7:0] to carry RID and other extra informational bits protected by a 16 bit cyclic redundancy check code method for a DDR5 NVDIMM-P in the example of FIG. 8C in less error detection latency then RS-ECC method. Line 871 of FIG. 8C is expanded out as table 870 showing bits replacing each byte ECG in line 871. ECC[7:0] of line 871 is replaced op[3:0], RID[13:0], Msg[13:0], Meta[15:0] and CRC-16 error detection. Two DDR5 channels of 32 Bytes of write or read transaction data bursts with 8 Bytes of extra Tag[7:0], WID or RID, and other information bits can be protected by the CRC-16 method.

Figure 8E:
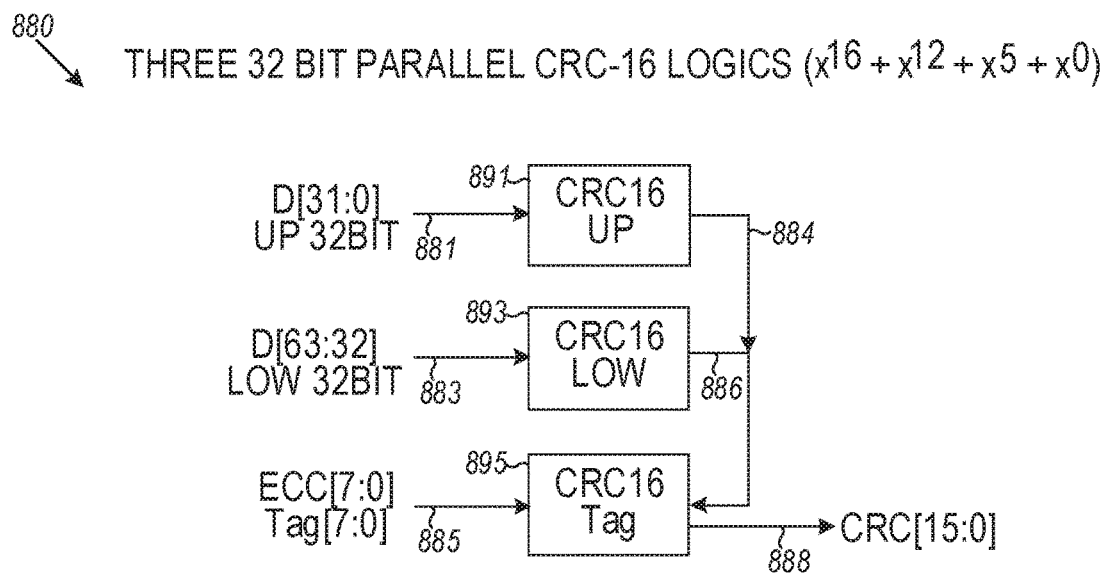

In an embodiment, the ECC of read data can be replaced by a CRC-16 code to protect data and a response message and a RID. FIG. 8E illustrates three fast parallel CRC-16 modules of CRC-16 up logics 891 and CRC-16 low logics 893 and CRC-16 Tag logics 895. At each clock beat, CRC-16 up module 891 makes calculation from D[31:0] 32 bit, which is input at 881, to obtain CRC_[47:32] as output 884, which is input to CRC-16 tag module 895. CRC-16 low module 893 makes calculation from D[63:32] 32 bit, which is input at 883, to obtain CRC_[31:16] as output 886, which is input to CRC-16 tag module 895. CRC-16 Tag module 895 makes calculation from ECC[7:0] and Tag [7:0], which is input at 885, and from inputs 884 and 886 to CRC-16 Tag module 895 to obtain CRC_[15:0] as output 888 to condense three set 16 bit CRC check bits (48 bits) into one final CRC[15:0] output. Table 892 of FIG. 8F shows equations from using a Verilog tool for combinatorial logics of parallel 32 bit CRC16 generator. The entries m0 . . . m7, M0 . . . M7, n0 . . . n7, N0 . . . N7 are 32 states of the CRC generator of shift registers running in parallel. The m0 . . . m7 are the combinatorial exclusive-or input D[7:0] and states of CRC shift registers reg[7:0]. The M0 . . . M7 are the combinatorial exclusive-or input D[15:8] and states of CRC reg[15:8] and previous states m0 . . . m7. The n0 . . . n7 are the combinatorial exclusive-or input D[23:16] and previous states m0 . . . m7 and M0 . . . M7. The N0 . . . N7 are the combinatorial exclusive-or input D[31:24] and previous states M0 . . . M7 and n0 . . . n7. Table 894 of FIG. 8G shows the registers assignment for CRC[15:0]=reg[15:0] check bits after 8 beats. At the host, this final CRC[15:0] should be equal to zero without error detected, or non-zero with errors. Then, the host should start error handling procedures of resending SEND cmd with the received RID.

The ECC codes in the write transactions could also be replaced by the CRC-16 in FIGS. 7A and 7C for fast error detection at low cost than RS-ECC method, wherein Op[1:0] and TID[13:0] could be written to DIMM controller directly.

FIG. 9 is an example illustrating an embodiment of an asynchronous interrupt signal encoding table 900. The asynchronous interrupt signal can be a fixed length signal. The encoding uses R_RDY (return ready), WC_INC, PWC_INC, Timeout_error, and TID_err interrupt signal levels as shown in FIG. 9. The fifth bit is a parity bit to protect the 3 bit interrupt messages with the first bit being a preamble "L" corresponding to fixed length. A preamble pulse may be used if parity bit cannot be synchronized to an ACT_n signal with bus in idle. Otherwise, back-to-back asynchronous signals can synchronize to an ACT_n pulse in four clock intervals.

FIG. 10 is an embodiment of an example of a data structure of a SEND command extended definition. The SEND command is similar to the SEND command of FIG. 6. Also shown is a table 1066 showing example op codes to be used in the data structure 1000 and the function and A[9:0] field for these example op codes. Op code [0001] can be used to set a TID Counter to a value carried in the A[9:0] field, which can initialize a NVDIMM TID. Op code [0010] can be used to fetch a set of TIDs from latest TID registers for diagnosing TID errors for the host to fetch the latest TIDs. Op code [0011] can be used to send a synch TID to DIMM periodically, without data fetch, in which the A[9:0] field provides the next TID for a periodic synch. Op code [0100] can be used to fetch 64 bytes of data and carry the next TID for DIMM TID counter to synch, in which the A[9:0] field provides a next TID as fetch read data. Op code [0101] can be used to fetch 64 bytes of data from a buffer and set a future skipped TID to guide a DIMM TID counter in which the A[9:0] field provides the next skipped TID. Op code [0110] can be used to fetch 64 bytes of data from NVDIMM-P buffer with a particular RID as host detected CRC error in which the A[9:0] field provides RID of fetched data with error. Op code [0111] can be used to fetch the latest PWID on the DDR data bus to confirm persistent write in which the A[9:0] field are reserved for future use. Op code [1111] can be used to provide an original normal SEND command to fetch 64 bytes of data from a read ready buffer in which the A[9:0] field are reserved for future use.

FIG. 11 is an embodiment of an example of a data structure 1100 of an example extended transaction command definitions of a protocol for a DDR4 NVDIMM-P. Shown in FIG. 11 are superscripts 1-4 that provide notes regarding the data field in which the respective superscript is shown. For note 1, CL (CAS latency)=0 or 1, 0 for 64 byte cache-line and 1 for a 256 byte of 4 cache-lines to boost bus performance. For note 2, a SEND command can be modified to add an op code and TID/VC for extra functions, for example as taught with respect to FIG. 6 details in page 4. For note 3, this data field can support an optional 14 bit TID or a 5 bit Hamming (31, 26) ECC code to protect the SEND command. For note 4, XPWRITE can be modified to support cache line persistent write and block persistent write with variable sizes.

Figure 12:
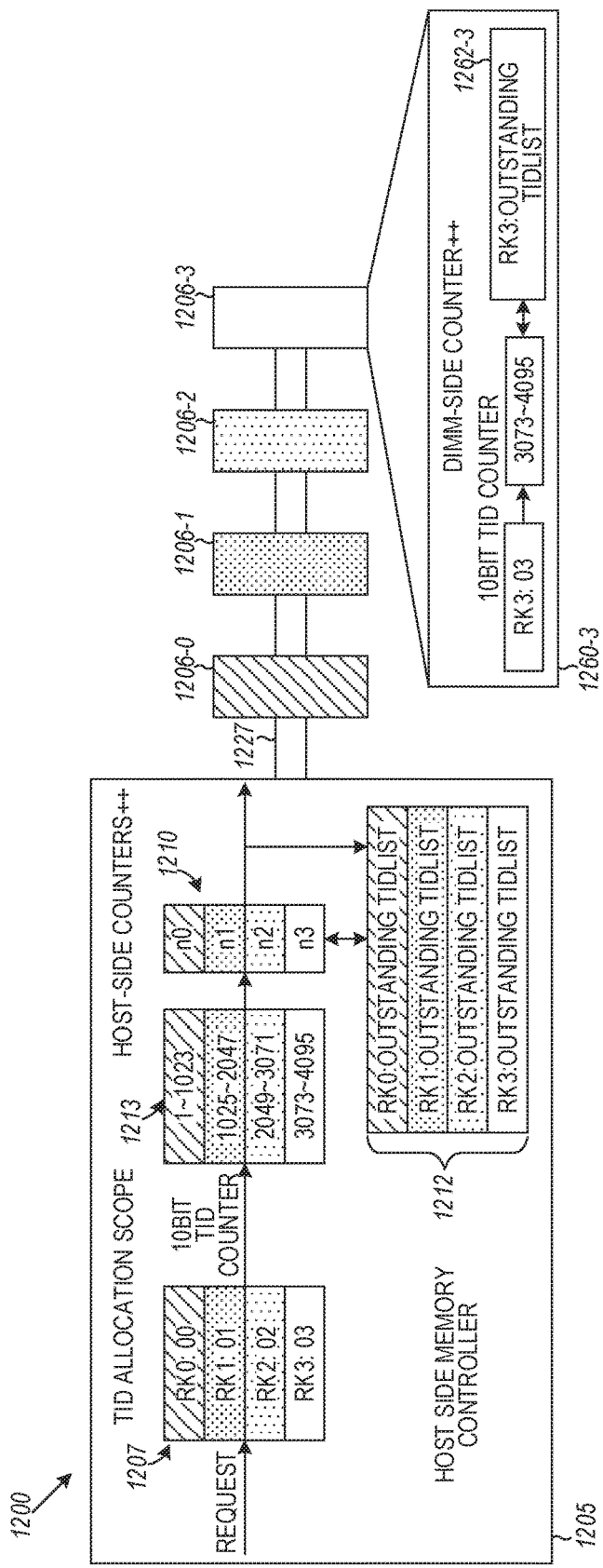
FIG. 12 is an example of transaction identification generation rules for multiple dual in-line memory modules on a bus, according to an example embodiment.

FIG. 12 is an embodiment of an example of TID generation rules for an arrangement 1200 of multiple DIMMs on a bus. Arrangement 1200 can include a host side memory controller 1205 having a set 1210 of incremental host-side counters n0, n1, n2, n3, a list 1207 identifying each of the DIMMs, a list 1213 identifying a range of candidate TIDs for each of the DIMMs, a set 1212 of lists of outstanding TIDs with a list for each of the identified DIMMS. List 1207 identifying each of the DIMMs and list 1213 identifying a range of candidate TIDs for each of the DIMMs can provide a TID allocation scope.

Arrangement 1200 can include the DIMMS 1206-0, 1206-1, 1206-2, and 1206-3 coupled on bus 1227 to host side memory controller 1205. DIMM 1206-3 can include a DIMM-side counter 1260-3 and a list 1262-3 of outstanding TIDs to generate a TID in DIMM 1206-3 independently, but in sync with a TID generated in host side memory controller 1205 for the same transaction, in a manner as taught herein. DIMM 1206-0, DIMM 1206-1, and DIMM 1206-2 can be structured similar to DIMM 1206-3 to generate a TID synced with host side memory controller 1205 in substantially the same process as implemented in DIMM 1206-3. Though four DIMMs are shown, arrangement 1200 can have more or less than four DIMMs. Though the range of candidate TIDs includes a number of TIDs available from an incremental 10 bit TID counter, other counters may be implement providing different ranges of candidate TIDs for each of the DIMMs. Arrangement 1200 can use one CS_n pin, and in this example with four DIMMS, the DIMMs may be accessed with external address C[2:0].

The TID counter values in arrangement 1200 can use 14 bits to support 1024 requests. A TID counter synchronization mechanism, as taught herein, can be used to sync the host side memory controller 1205 individually with each of the DIMMs 1206-0, 1206-1, 1206-2, and 1206-3, which mechanism can include host side memory controller 1205 setting both sides' TID counters to the same value; memory controller 1205 generating a SEND with op code [0001] and with a TID value to set each DIMM side TID counter to this TID value; and memory controller 1205 generating a SEND with op code [0010] with a TID value to synch DIMM-side TID, as the host fetches ready data. The host side memory controller 1205 can operate with each of the DIMMs 1206-0, 1206-1, 1206-2, and 1206-3 with respect to TIDs as taught herein including implementing a skip outstanding TIDs scheme, a parity pattern check, and a write ECC check. TID allocation can be implemented for multiple bus channels, multiple DIMMs in each channel. For example, an independent TID counter and an independent allocate scope can be realized for each NVDIMM-P device of multiple NVDIMM-Ps.

In various embodiments, a host can conduct a TID error handling mechanism upon notification of a TID error at a DIMM. For a relatively normal fail, a TID_ERROR_ALERT signal from the DIMM immediately alerts the host. The alert signal may be through a RW_RDY line. The host can fetch TID error information from a TID error register of the DIMM using a modified SEND. Then, the host can re-issue any read request after the TID_ERROR_ALERT signal has been received and processed. If a retry of a transaction fails, the host may use a modified SEND command to fetch a batch of previous TIDs, if re-issuing the read or write request failed to fix TID errors, and report the interrupt to a system alert mechanism of a system in the host is active.

Figure 13:
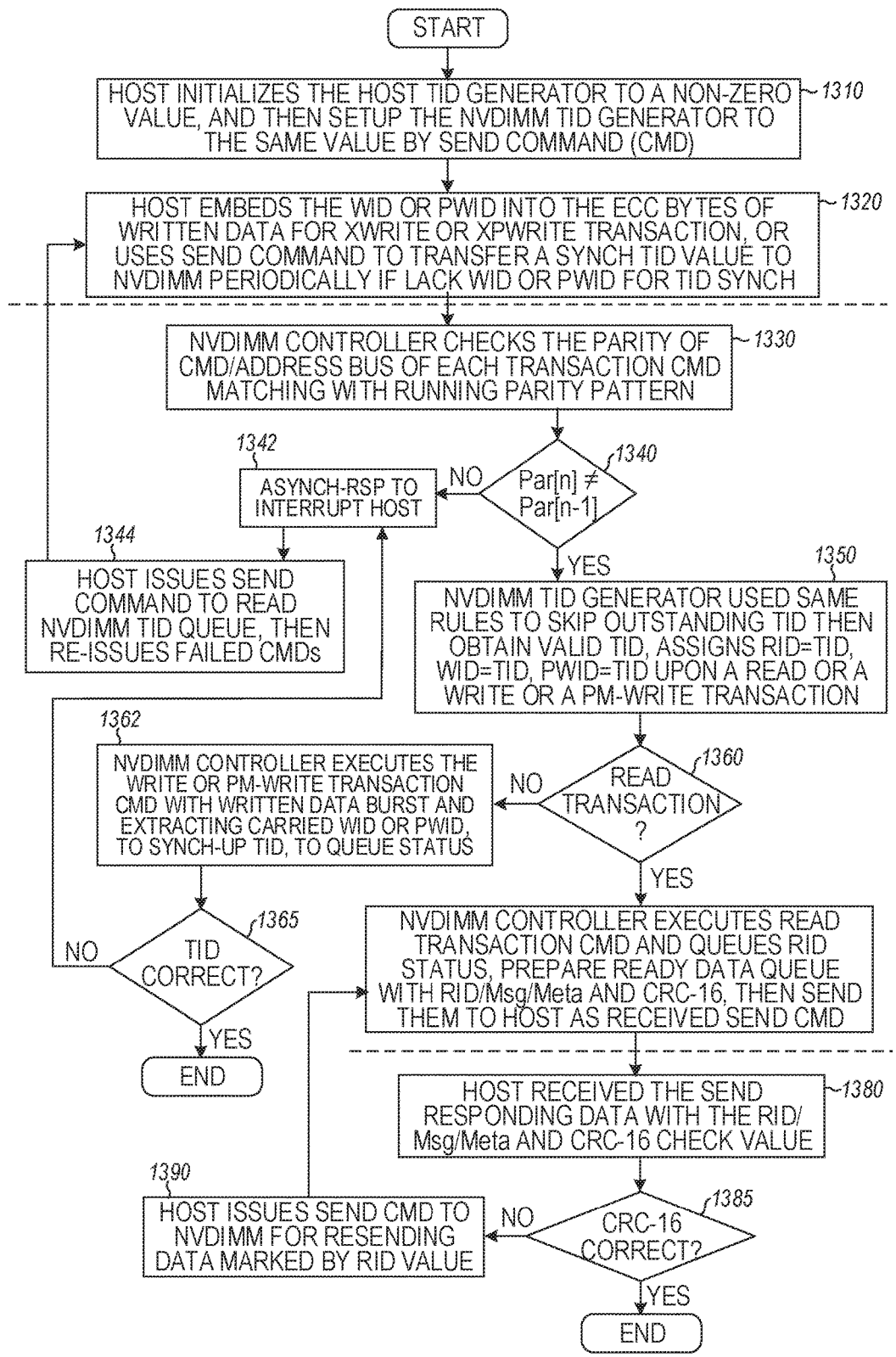
FIG. 13 is a flow diagram of features of transaction identification error handling procedures, according to an example embodiment.

FIG. 13 is a flow diagram of features of an embodiment of transaction identification error handling procedures 1300 between a host and a NVDIMM. At 1310, a host initializes the host TID generator to a non-zero value, and then sets up the NVDIMM TID generator to the same value by generating SEND command. At 1320, the host embeds a WID or PWID into ECC bytes of write data for a write or PM-write transaction command, or uses SEND command to transfer a synch TID value to the NVDIMM periodically if it lacks WID or PWID for TID synch. At 1330, the NVDIMM controller checks the parity of the CMD/Address bus of each transaction command matching with running parity pattern. At 1340, a determination of whether Par[n] does not equal an inverse of Par[n−1].

At 1342, the NVDIMM controller sends an asynchronous response to interrupt the host, if the determination at 1340 is that the parity does not match the running parity pattern. At 1344, the host issues a SEND command to read the NVDIMM TID queue, then re-issues failed commands and returns to 1330 in the procedure to continue as in the flow diagram from 1130. At 1350, upon the determination at 1340 that the parity matches the running parity pattern, the NVDIMM TID generator uses same rules, as used by the host, to skip outstanding TID then obtain valid TID, assigns RID=TID, WID=TID, or PWID=TID upon a read or a write or a PM-write transaction. At 1360, a determination is made as to whether the transaction is a read transaction.

At 1362, if the transaction is not a read transaction, the NVDIMM controller executes the write or PM-write transaction command with write burst data and extracts carried WID or PWID, to synch-up TID, to queue status. At 1365, a determination is made as to whether the TID is correct. If the TID is not correct, the procedure returns to 1342 and follows the procedure from there. It the TID is correct, the procedure completes.

At 1370, if the transaction is a read from the determination at 1360, the NVDIMM controller executes the read transaction command and queues RID status, prepares ready data queue with RID/Msg/Meta and CRC-16, then sends them to host as received SEND command.

At 1380, the host receives the SEND having responding data with the RID/Msg/Meta and CRC-16 check value. At 1385, a determination is made as whether the CRC-16 is correct. If the application of the CRC-16 is correct, the procedure ends.

At 1390, upon determination that the CRC-16 is not correct, the host issues SEND command to NVDIMM for resending data marked by RID value. From 1390, the procedure proceeds to 1370 to re-enter the procedure and conduct 1370.

Figure 14A:
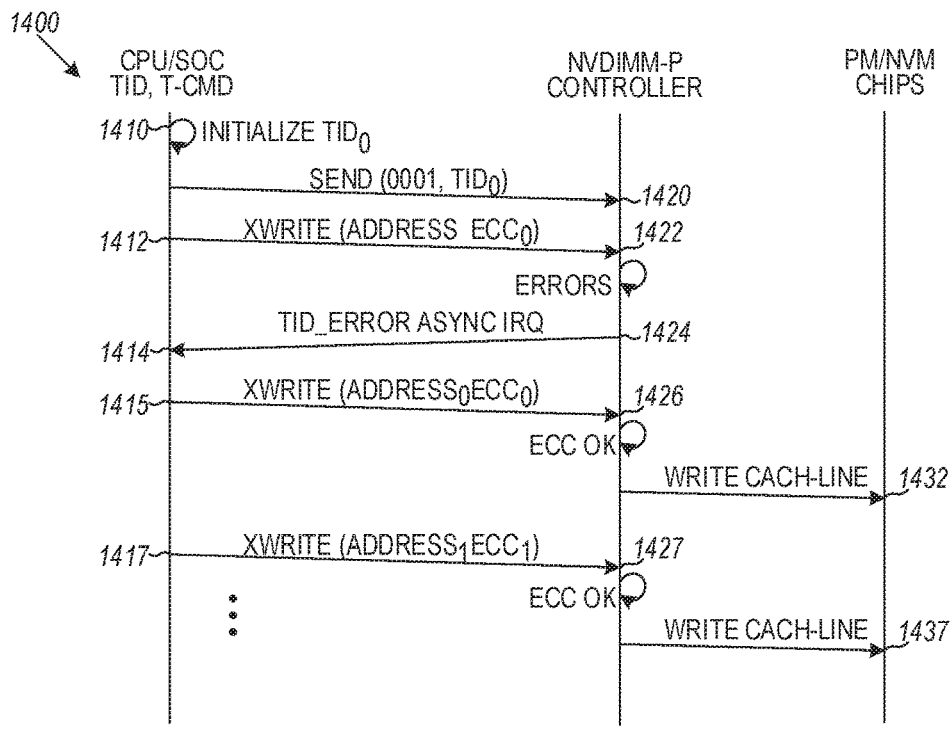
FIG. 14A is a flow diagram of features of a write transaction and error handling mechanism, according to an example embodiment.

FIG. 14A is a flow diagram of features of an embodiment of a write transaction and error handling mechanism 1400. At 1410, a CPU or system on a chip (SOC) initializes a $TID_0$ and generates a SEND command with the $TID_0$ with a [0001] op code to a NVDIMM-P controller, which is received by the NVDIMM-P controller at 1420. At 1412, the CPU/SOC generates a XWRITE command with an $address_0$ and $ECC_0$. At 1422, the NVDIMM-P controller receives the $address_0$ and $ECC_0$ and determines that there are errors. At 1424, the NVDIMM-P controller generates a TID_error on an asynchronous IRQ, which is an interrupt line. At 1414, the TID_error is received by the CPU/SOC. At 1415, the CPU/SOC generates a XWRITE command with $address_0$ and $ECC_0$. At 1426, the XWRITE command with $address_0$ and $ECC_0$ is received at the NVDIMM-P controller. With a determination that the received $address_0$ and $ECC_0$ have no error with the determination that the ECC is okay, the NVDIMM-P controller provides the data on a write cache line to the appropriate PM/NVM chips, where the data is received at 1432. After handling the error, transactions between the CPU/SOC continue with the CPU/SOC generating a XWRITE command with $address_1$ and $ECC_1$ at 1417. At 1427, the XWRITE command with $address_1$ and $ECC_1$ is received and determination that the received $address_1$ and $ECC_1$ have no error with the determination that the ECC is okay, the NVDIMM-P controller provides the data on a write cache line that is received by the appropriate PM/NVM chips at 1437.

Figure 14B:
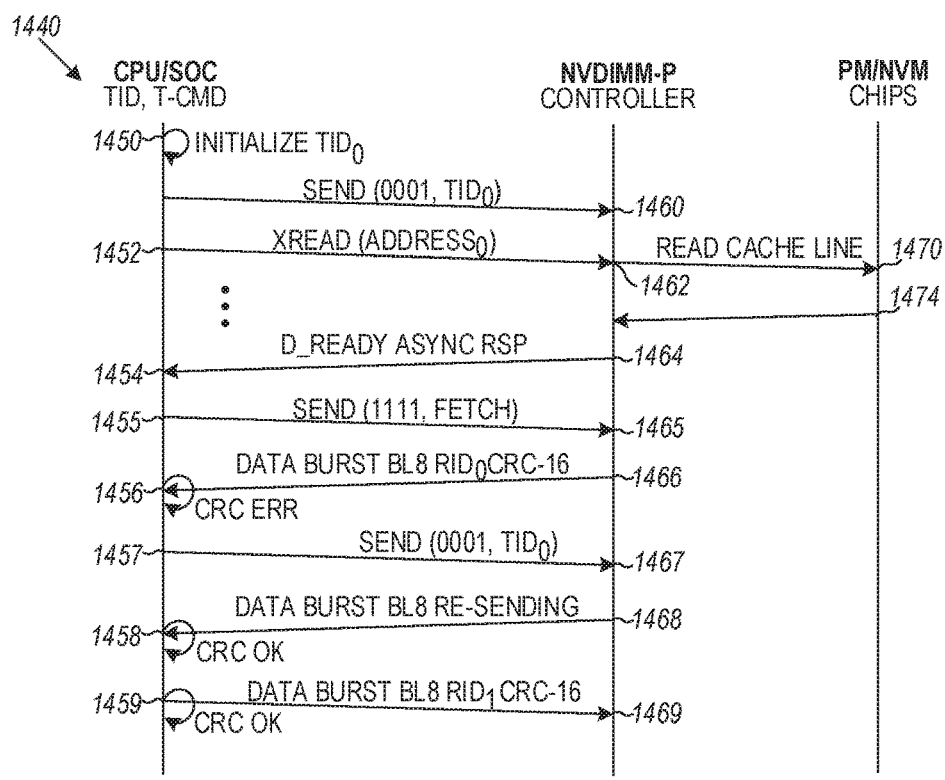
FIG. 14B is a flow diagram of features of a read transaction and error handling mechanism, according to an example embodiment.

FIG. 14B is a flow diagram of features of an embodiment of a read transaction and error handling mechanism 1440. At 1450, a CPU or SOC initializes a $TID_0$ and generates a SEND command with the $TID_0$ with a [0001] op code to a NVDIMM-P controller, which is received by the NVDIMM-P controller at 1460. At 1452, the CPU/SOC generates a XWRITE command with an $address_0$. At 1462, the NVDIMM-P controller receives the $address_0$ and provides the $address_0$ on a read cache-line to a PM/NVM chip at 1472. At 1444, the PM/NVM chip communicates with the NVDIMM-P controller to generate a data ready asynchronous response, at 1464, to the CPU/SOC. At 1454, the CPU/SOC receives the data ready asynchronous response. At 1455, the CPU/SOC generates a SEND command with a (1111) op code to fetch the data. The SEND command is received at the NVDIMM-P controller, at 1465. At 1466, the NVDIMM-P controller generates a data burst BL8 along with a $RID_0$ and CRC-16 to the CPU/SOC, from which the CPU/SOC can determine a CRC error. At 1456, in response to the CRC error, the CPU/SOC generates a SEND command with a (0001) op code and $TID_0$, which is received by the NVDIMM-P controller, at 1467. At 1468, the NVDIMM-P controller resends the data burst BL8 to the CPU/SOC. At 1458, the CPU/SOC can determine that there is no CRC error. At 1469, the NVDIMM-P controller sends the data burst BL8, $RID_1$, and CRC-16 to the CPU/SOC. At 1459, the CPU/SOC can determine that there is no CRC error.

Figure 15:
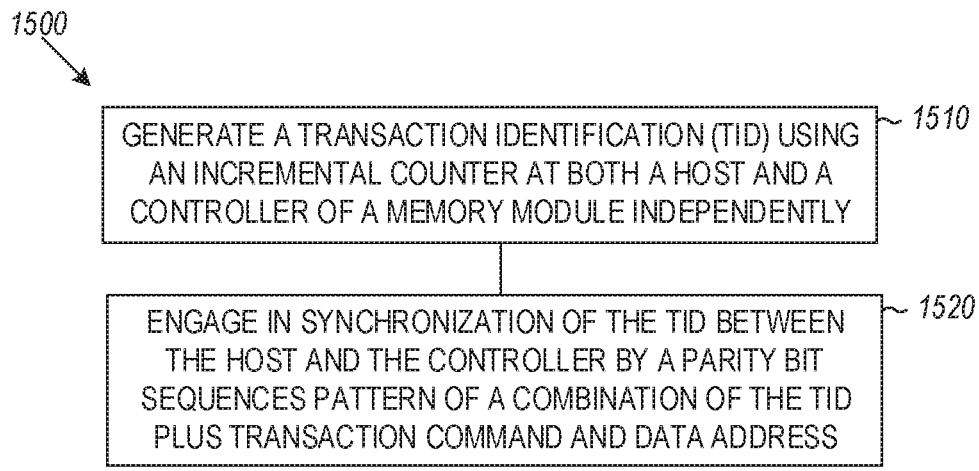
FIG. 15 is a flow diagram of elements of an example method of synchronizing a transaction between a host and memory module, according to an example embodiment.

FIG. 15 is a flow diagram of elements of an embodiment of an example method 1500 of synchronizing a transaction between a host and memory module. At 1510, a TID is generated using an incremental counter at both a host and a controller of a memory module independently. At 1520, synchronization of the TID between the host and the controller is engaged by a parity bit sequences pattern of a combination of the TID plus transaction command and data address. In addition, a WID can be embedded into ECCs by the host or a RID can be inserted with ECCs/CRCs by the controller, for transmission through a noisy memory channel with more errors. A generated transaction command by the host can be reconstructed and/or retransmitted after detecting a received TID with error caused by noise of the noisy memory channel.

Variations of method 1500 or methods similar to method 1500 can include a number of features of different embodiments, as taught herein, that may or may not be combined depending on the application of such methods and/or the architecture of systems in which such methods are implemented. Generating the TID and engaging in the synchronization of the TID can include, at the host, generating a count number using the incremental counter in the host; incrementing the count number if the count number is being used by an outstanding transaction identification for unfinished operations; generating a parity bit from a combination of bits of the count number, transaction command bits, and data address bits, when the count number is not being used by an outstanding transaction identification for unfinished operations; setting or adjusting the TID from the count number upon determination that the TID is not used by an outstanding transaction identification and upon the parity matching to a running parity sequence pattern; assigning the set or adjusted TID to be a WID, a PWID, or a RID; and transmitting the parity bit with the command bits and data address bits to the controller of the memory module from the host over a SDR command/address bus, as a parity sequence to synch the TID generated by the controller to the TID generated by the host. Generating the TID and engaging in the synchronization of the TID can include, at the controller of the memory module, receiving, from the host, a parity bit, command bits, and data address bits over a SDR command/address bus; verifying whether the received parity bit matches with a running parity sequence pattern; if parity error is detected, interrupting the host, by an asynchronous response signal additional to a double data rate (DDR) bus alert signal, to reconstruct and/or retransmit the transaction command and data address; generating a count number using the incremental counter of the controller of the memory module; skipping the count number upon determination that the count number is being used by an outstanding transaction identification; generating a parity bit of a combination of bits of the count number and the received command bits and data address bits from the host; comparing the generated parity bit with the parity bit from the host; in an iterative procedure, if the generated parity bit is not equal to received parity bit from the host, incrementing the count number and regenerating a parity bit from of a combination of bits of the incremented count number and the received command bits and data address bits from the host, until the regenerated parity bit equals to the parity bit from the host providing the incremented count number as a validated number; and assigning the validated number to be the TID and executing the associated transaction command with the data address. Generating the TID and engaging in the synchronization of the TID can include processing an error alert to handle a TID error and communication of a number of TIDs used in previous synchronizations between the host and the controller of the memory module.

Method 1500 or methods similar to method 1500 can include initialization of the incremental counter of the controller of the memory module with a host TID initialization number carried by a SEND command generated by the host to setup the incremental counter of the controller of the memory module synchronized to the received host TID initialization number.

Method 1500 or methods similar to method 1500 can include embedding the WID or a persistent memory (PM) write transaction identification (PWID) for a PM write transaction into the ECC codes of data corresponding to a XWRITE command of the write transaction or a XPWRITE command of the PM write transaction at the host by: assigning a validated count number to be the WID or the PWID by the incremental counter at the host; calculating 8 bytes ECC codes from combination of the data corresponding to the XWRITE command or the XPWRITE command, with two bits of operational codes, and the WID or the PWID, beat-by-beat; and transmitting the data burst including the 8 bytes ECC codes to the controller of the memory module without the WID or the PWID. Method 1500 or methods similar to method 1500 can include, with respect to the WID or a persistent memory (PM) write transaction identification (PWID) for a PM write transaction embedded into the ECC codes of data corresponding to a XWRITE command of the write transaction or a XPWRITE command of the PM write transaction at the host, at the controller of the memory module: receiving, from the host, the XWRITE command or the XPWRITE command and corresponding data address from a single data rate (SDR) command/address bus with a data burst from a double data rate (DDR) bus including the ECC codes corresponding to the write command or the PM write command; extracting or regenerating the WID or the PWID from the parity, command, and address bits; using an ECC decoder to correct a one bit error in the data burst and to double check whether the error is located in two bits of operation code or in the WID or PWID, where the WID or PWID is one of a full TID number, two repeated differences of consecutive WIDs or PWIDs, or a TID synchronization number, and extracting the 2 bits op-codes by bit-flipping trials; interrupting the host by an asynchronous response signal to reconstruct and/or retransmit the XWRITE command or the XPWRITE command if uncorrectable errors were detected in the data burst or two bits of operation code or in the WID or PWID by the ECC decoder at the at the controller of the memory module; and executing the XWRITE command or the XPWRITE command with data address and data burst upon no detection of error.

Method 1500 or methods similar to method 1500 can include embedding op[1:0] and TID[Δ5:Δ0] into the 8 bytes ECC codes includes the transaction command and address bits, for the next generation double data rate (DDR5) usages with higher probability command/address errors, that the 64 bits data, 8 bits Tag and 8 bits ECC are transferred thru the DDR5 data channel, 6 bits command/address are transferred thru the C/A control bus, 2 bits op[1:0] and TID[Δ5:Δ0] are not transferred, the TID[Δ5:Δ0] being generated by the host and by controller for syncing.

Method 1500 or methods similar to method 1500 can include using 8 bytes of ECC codes of SEND data in protection of a responding read transaction data burst from the controller of the memory module to the host over a double data rate (DDR) bus, the error-correcting code being replaced by a 16 bit cyclic redundancy check (CRC-16) code to protect 64 bit data, an 8 bit operational code, and 14 bits RID, plus 14 bits message, 16 bits metadata, and CRC-16 bits are spread within 8 bytes of the ECC provided as in 8 bursts. Multiple parallel CRC computation modules can be used with condensed CRC check bits to reduce computation latency and the probability of undetected errors notably. The same parallel CRC method could also replace ECC in write transactions for low computation latency with simplified hardware.

Method 1500 or methods similar to method 1500 can include, with respect to a SEND data and ECC carrying a RID of the reading data burst of ready read data over a double data rate (DDR) bus of a read transaction, the host: receiving the data burst and ECC codes; running a 16 bit cyclic redundancy check (CRC-16) code to detect errors; issuing a new SEND command with the same RID to retry fetching the ready read data if the host detected CRC-16 error; and closing the read transaction with success status if the host detects no CRC-16 error, and then delivering the data burst to an associated central processing unit (CPU) core.

Method 1500 or methods similar to method 1500 can include implementing a CRC-16 generator by three parallel CRC-16 combinatorial exclusive-or logics for upper 32 bits data and lower 32 bit data and 16 bits Tag plus op[3:0]/RID [13:0] or the extra information or CRC[15:0] codes for DDR5 usages, then feeding the partial CRC-16 results from the lower CRC-16 logics and Tag CRC-16 logics into the upper CRC-16 logics to obtain the final CRC[15:0] checksum; the CRC[15:0] bits fitted into the $ECC_6$ and $ECC_7$ bytes at the DIMM controller, or the CRC[15:0] checksum verified for errors at the host.

Figure 16:
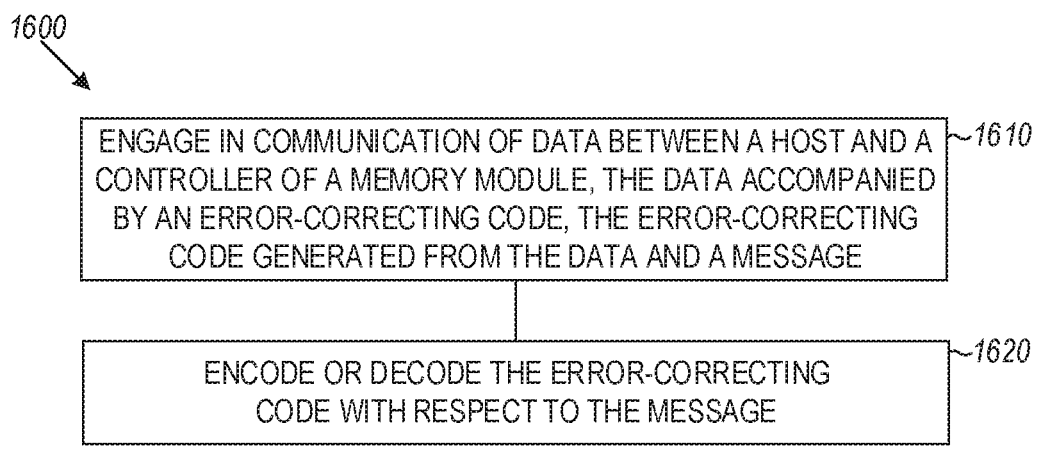
FIG. 16 is a flow diagram of elements of an example method of message transfer between a memory module and a host, according to example embodiments.

FIG. 16 is a flow diagram of elements of an embodiment of an example method 1600 of message transfer between a memory module and a host. At 1610, communication of data is engaged between a host and a controller of a memory module, the data accompanied by an error-correcting code, where the error-correcting code is generated from the data and a message. At 1620, the error-correcting code encoded or decoded with respect to the message. Engaging in the communication and encoding the error-correcting code can include, at the controller of the memory module, calculating the error-correcting code from the data and the message; and using a synchronous interrupt signal with fix-length pulse pattern to carry the data accompanied by the error-correcting code. Embedding a response message with data into ECC codes provides an efficient mechanism to transfer the response message between a controller of a memory module and a host without adding an extra response bus. An example includes embedding 16 bits of a response message into 8 bytes of an ECC code for 64 bytes of data without requiring an extra response bus.

In various embodiments as taught herein, enhancements are provided for interaction between a host and one or more memory modules. A host can initialize a device TID counter in a memory module to a desired value, which provides full control by the host. Such initialization can be realized with the host initializing a DIMM device TID generation scheme to any desired value, without bus overhead. The host can use existing ECC structure for write data to assign a TID to a DIMM device by modifying the ECC to be calculated using additional data used with the write data. This embeds a WID into the write data's ECC to directly assign the DIMM device with TID=WID. A 1 bit parity scheme, as a Markov chain, can be used to provide host TID information to a DIMM device. The DIMM device can be locked in, with XREAD transactions, using the 1 bit scheme to provide TID synchronization information. The DIMM device can guide RID assignment for XREAD implicitly from detection of a TID chain error to alert the host for a regeneration and/or retransmission for fixing the RID error before XREAD execution. In addition, an immediate error alert or interrupt mechanism to host without overhead, which can be conducted by one interrupt line to alert the host immediately after a TID error, for both XREAD and XWRITE transactions.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A communication method for communication between a host and a memory controller, the communication method comprising:
    generating, at the host, a transaction identification (TID) for a transaction using an incremental counter;
    generating a parity bit from parity of the TID and parity of a transaction command and data address for the transaction;
    comparing the parity bit to a parity bit sequences pattern and forcing the parity bit to match the parity bit sequences pattern;
    setting the matching parity bit to a host parity bit;
    transmitting the host parity bit along with the transaction command and data address from the host to the memory controller of a memory module;
    embedding, by the host, bits to specify a write transaction identification (WID) of a write transaction into error correcting codes (ECCs) of write data and transmitting the write data with the ECCs to the memory controller for transmission through a noisy memory channel; and
    reconstructing and/or retransmitting a generated transaction command by the host after detecting a received TID with error caused by noise of the noisy memory channel.

2. The communication method of claim 1, wherein transmitting the host parity bit along with the transaction command and data address includes transmitting the host parity bit along with the transaction command and data address to the memory controller from the host over a single data rate (SDR) command/address bus.

3. The communication method of claim 1, wherein the communication method includes:
    generating, at the host, an initialization TID; and
    sending, from the host, the initialization TID in a SEND command to the memory controller to setup an incremental counter of the memory controller synchronized to the initialization TID.

4. The communication method of claim 1, wherein the communication method includes embedding the bits for the WID or bits for a write persistent memory transaction identification (PWID) of a persistent memory (PM) write transaction into the ECC codes of data corresponding to a XWRITE command of the write transaction or a XPWRITE command of the PM write transaction at the host by:
    assigning a validated count number to be the WID or the PWID by the incremental counter at the host;
    calculating 8 bytes ECC codes from combination of the data corresponding to the XWRITE command or the XPWRITE command, with two bits (op[1:0]) of operational codes and the bits (TID[Δ4:Δ0]) for the WID or the PWID, beat-by-beat; and
    transmitting the data including the 8 bytes ECC codes to the controller of the memory module without the WID or the PWID.

5. The communication method of claim 4, wherein transmitting the data beat-by-beat includes transmitting 64 bits data, 8 bits Tag, and 8 bits ECC thru a fifth generation double data rate (DDR5) data channel, 6 bits command/address (C/A) thru a C/A control bus, with op[1:0] and TID[Δ4:Δ0] not being transferred.

6. The communication method of claim 1, wherein the communication method includes, with respect to a SEND data and ECC carrying a read transaction identification (RID) of a read data burst of ready read data over a double data rate (DDR) bus of a read transaction, the host:
    receiving the data burst and ECC codes;
    running a cyclic redundancy check (CRC) code to detect errors;
    issuing a new SEND command with the same RID to retry fetching the ready read data if the host detected CRC error; and
    closing the read transaction with success status if the host detects no CRC error, and then delivering the data burst to an associated central processing unit (CPU) core.

7. A host apparatus comprising:
    transaction identification (TID) generator having an incremental counter to generate a TID for a transaction in a communication between the host apparatus and a memory controller;
    a parity bit generator to generate a parity bit from parity of the TID and parity of a transaction command and data address for the transaction;
    a comparator to compare the parity bit to a parity bit sequences pattern and force the parity bit to match the parity bit sequences pattern;
    logic to set the matching parity bit to a host parity bit;
    a central processing unit (CPU) configured to:
        transmit the host parity bit along with the transaction command and data address from the host apparatus to the memory controller of a memory module;
        embed bits to specify a write transaction identification (WID) of a write transaction into error correcting codes (ECCs) of write data and to transmit the write data with the ECCs to the memory controller for transmission through a noisy memory channel; and
        reconstruct and/or to retransmit a generated transaction command after detection of a received TID with error caused by noise of the noisy memory channel.

8. The host apparatus of claim 7, wherein the CPU is configured to transmit the host parity bit along with the transaction command and data address to the memory controller over a single data rate (SDR) command/address bus.

9. The host apparatus of claim 7, wherein:
    the TID generator is configured to generate an initialization TID; and
    the CPU is configured to send the initialization TID in a SEND command to the memory controller to setup an incremental counter of the memory controller synchronized to the initialization TID.

10. The host apparatus of claim 7, wherein the CPU is configured to embed the bits for the WID or bits for a write persistent memory transaction identification (PWID) of a persistent memory (PM) write transaction into the ECC codes of data corresponding to a XWRITE command of the write transaction or a XPWRITE command of the PM write transaction by operations to:
    assign a validated count number to be the WID or the PWID by the incremental counter at the host;
    calculate 8 bytes ECC codes from combination of the data corresponding to the XWRITE command or the XPWRITE command, with two bits (op[1:0]) of operational codes and the bits (TID[Δ4:Δ0]) for the WID or the PWID, beat-by-beat; and transmit the data including the 8 bytes ECC codes to the controller of the memory module without the WID or the PWID.

11. The host apparatus of claim 10, wherein transmission of the data beat-by-beat includes transmission of 64 bits data, 8 bits Tag, and 8 bits ECC thru a fifth generation double data rate (DDR5) data channel, 6 bits command/address (C/A) thru a C/A control bus, with op[1:0] and TID[Δ4:Δ0] not being transferred.

12. The host apparatus of claim 7, wherein, with respect to a SEND data and ECC carrying a read transaction identification (RID) of a read data burst of ready read data over a double data rate (DDR) bus of a read transaction, the host is configured to:

receive the data burst and ECC codes;
run a cyclic redundancy check (CRC) code to detect errors;
issue a new SEND command with the same RID to retry fetching the ready read data if the host detected CRC error; and
close the read transaction with success status if the host detects no CRC error, and then deliver the data burst to an associated CPU core.

13. A non-transitory computer-readable media storing computer instructions for communication between a host and a memory controller, that when executed by one or more processors, cause the one or more processors to perform the steps of:

generating, at the host, a transaction identification (TID) for a transaction using an incremental counter;
generating a parity bit from parity of the TID and parity of a transaction command and data address for the transaction;
comparing the parity bit to a parity bit sequences pattern and forcing the parity bit to match the parity bit sequences pattern;
setting the matching parity bit to a host parity bit;
transmitting the host parity bit along with the transaction command and data address from the host to the memory controller of a memory module;
embedding, by the host, bits to specify a write transaction identification (WID) of a write transaction into error correcting codes (ECCs) of write data and transmitting the write data with the ECCs to the memory controller for transmission through a noisy memory channel; and
reconstructing and/or retransmitting a generated transaction command by the host after detecting a received TID with error caused by noise of the noisy memory channel.

14. The non-transitory computer-readable media of claim 13, wherein transmitting the host parity bit along with the transaction command and data address includes transmitting the host parity bit along with the transaction command and data address to the memory controller from the host over a single data rate (SDR) command/address bus.

15. The non-transitory computer-readable media of claim 13, wherein the communication method includes:

generating, at the host, an initialization TID; and
sending, from the host, the initialization TID in a SEND command to the memory controller to setup an incremental counter of the memory controller synchronized to the initialization TID.

16. The non-transitory computer-readable media of claim 13, wherein the communication method includes embedding the bits for the WID or bits for a write persistent memory transaction identification (PWID) of a persistent memory (PM) mite transaction into the ECC codes of data corresponding to a XWRITE command of the write transaction or a XPWRITE command of the PM write transaction at the host by:

assigning a validated count number to be the WID or the PWID by the incremental counter at the host;
calculating 8 bytes ECC codes from combination of the data corresponding to the XWRITE command or the XPWRITE command, with two bits (op[1:0]) of operational codes and the bits (TID[Δ4:Δ0]) for the WID or the PWID, beat-by-beat; and
transmitting the data including the 8 bytes ECC codes to the controller of the memory module without the WID) or the PWID.

17. The non-transitory computer-readable media of claim 16, wherein transmitting the data beat-by-beat includes transmitting 64 bits data, 8 bits Tag, and 8 bits ECC that a fifth generation double data rate (DDR5) data channel, 6 bits command/address (C/A) thru a C/A control bus, with op[1:0] and TID[66 4:Δ0] not being transferred.

18. The non-transitory computer-readable media of claim 13, wherein the communication method includes, with respect to a SEND data and ECC carrying a RID of a read data burst of ready read data over a double data rate (DDR) bus of a read transaction, the host:

receiving the data burst and ECC codes;
running a cyclic redundancy check (CRC) code to detect errors;
issuing a new SEND command with the same RID to retry fetching the ready read data if the host detected CRC error; and
closing the read transaction with success status if the host detects no CRC error, and then delivering the data burst to an associated central processing unit (CPU) core.

* * * * *